United States Patent
Kojima et al.

(10) Patent No.: US 10,103,347 B2
(45) Date of Patent: Oct. 16, 2018

(54) TRANSPARENT ELECTRODE, METHOD FOR MANUFACTURING SAME, AND ORGANIC ELECTROLUMINESCENT ELEMENT

(71) Applicant: Konica Minolta, Inc., Tokyo (JP)

(72) Inventors: Shigeru Kojima, Hino (JP); Kazuhiro Yoshida, Tachikawa (JP); Shun Furukawa, Sagamihara (JP); Takeshi Hakii, Sagamihara (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 15/555,390

(22) PCT Filed: Nov. 27, 2015

(86) PCT No.: PCT/JP2015/083461
§ 371 (c)(1),
(2) Date: Sep. 1, 2017

(87) PCT Pub. No.: WO2016/143201
PCT Pub. Date: Sep. 15, 2016

(65) Prior Publication Data
US 2018/0040846 A1    Feb. 8, 2018

(30) Foreign Application Priority Data
Mar. 6, 2015 (JP) ................. 2015-044506

(51) Int. Cl.
*H01L 51/52* (2006.01)
*H05B 33/28* (2006.01)
(Continued)

(52) U.S. Cl.
CPC ............ *H01L 51/5215* (2013.01); *B32B 7/02* (2013.01); *B32B 15/04* (2013.01); *C23C 18/31* (2013.01);
(Continued)

(58) Field of Classification Search
CPC .. H01L 51/0022; H01L 51/5215; H05B 33/28
See application file for complete search history.

(56) References Cited

FOREIGN PATENT DOCUMENTS

| JP | 2011171015 A | 9/2011 |
|---|---|---|
| JP | 2013152850 A | 8/2013 |

(Continued)

OTHER PUBLICATIONS

Machine Traslation of JP 2013-161589 A.*
(Continued)

*Primary Examiner* — Daniel Shook
(74) *Attorney, Agent, or Firm* — Lucas & Mercanti, LLP

(57) ABSTRACT

A transparent electrode includes: a substrate; and a conductive metal layer on the substrate. The conductive metal layer has a thin metal wire and a plating layer. The plating layer covers the thin metal wire. The transparent electrode further includes a transparent conductive layer on a surface of the substrate on a side on which the thin metal wire is formed. The transparent conductive layer covers the substrate and the conductive metal layer. The thin metal wire is formed using a metal nanoparticle ink or a metal complex ink.

18 Claims, 7 Drawing Sheets

(51) Int. Cl.
*B32B 7/02* (2006.01)
*H01B 5/14* (2006.01)
*B32B 15/04* (2006.01)
*C23C 18/31* (2006.01)
*H01L 51/00* (2006.01)
*H05K 1/02* (2006.01)
*C25D 3/12* (2006.01)
*C25D 3/38* (2006.01)
*C25D 3/46* (2006.01)
*C25D 5/12* (2006.01)
*C23C 18/38* (2006.01)
*H05K 1/09* (2006.01)
*H05K 3/24* (2006.01)

(52) U.S. Cl.
CPC ........... *H01B 5/14* (2013.01); *H01L 51/0022* (2013.01); *H05B 33/28* (2013.01); *H05K 1/0274* (2013.01); *B32B 2307/202* (2013.01); *B32B 2307/412* (2013.01); *B32B 2457/206* (2013.01); *C23C 18/38* (2013.01); *C25D 3/12* (2013.01); *C25D 3/38* (2013.01); *C25D 3/46* (2013.01); *C25D 5/12* (2013.01); *H01L 2251/303* (2013.01); *H01L 2251/305* (2013.01); *H05K 1/097* (2013.01); *H05K 3/246* (2013.01); *H05K 2201/0108* (2013.01); *H05K 2201/0329* (2013.01); *H05K 2201/09681* (2013.01); *H05K 2203/121* (2013.01)

(56) References Cited

FOREIGN PATENT DOCUMENTS

| | | |
|---|---|---|
| JP | 2013161589 A | 8/2013 |
| JP | 2014120353 A | 6/2014 |
| JP | 2014175560 A | 9/2014 |

OTHER PUBLICATIONS

Machine Translation of JP 2014-120353 A.*
Machine Translation of JP 2011-171015 A.*
Machine Translation of JP 2013-152850 A.*
International Preliminary Report on Patentability dated Feb. 9, 2016 from corresponding International Application No. PCT/JP2015/083461 and English translation.
International Search Report dated Feb. 9, 2016 for PCT/JP2015/083461 and English translation.

* cited by examiner

TRANSPARENT ELECTRODE, METHOD FOR MANUFACTURING SAME, AND ORGANIC ELECTROLUMINESCENT ELEMENT

CROSS REFERENCE TO RELATED APPLICATION

This Application is a 371 of PCT/JP2015/083461 filed on Nov. 27, 2015, which, in turn, claimed the priority of Japanese Patent Application No. JP2015-044506 filed on Mar. 6, 2015, both applications are incorporated herein by reference.

TECHNOLOGICAL FIELD

The present invention relates to a transparent electrode, a method for manufacturing the same and an organic electroluminescent element; to be specific, relates to a transparent electrode having a plated thin metal wire(s) and a transparent conductive layer, and so forth.

BACKGROUND ART

With the recent growing demand for flat-screen television receivers, display technologies of various systems, including those making use of liquid crystal, plasma, organic electroluminescence (hereinafter may be called "organic EL") and field emission, have been developed. For any of these displays of different display systems, a transparent electrode is an essential component. The transparent electrode is indispensable not only for television receivers but also for touchscreens, mobile phones, electronic paper, various solar cells and various electroluminescence control elements.

In particular, organic EL elements used for illumination and highly efficient solar cells are required to have a large area. Hence, an electrode having low resistance is required. In addition, demands for stable use for a long period of time under a high temperature environment and for maintenance of flexibility have been increasing.

For example, there is described in Patent Document 1 a method of calcining, by infrared ray irradiation, thin metal wires printed using an ink containing silver nanoparticles, and its effectiveness is known. However, an electrode showing low resistance and further improvement in storability is required.

RELATED ART DOCUMENTS

Patent Documents

Patent Document 1: Japanese Patent Application Publication No. 2014-175560

SUMMARY

To achieve at least one of the aforementioned objects, according to an aspect of the present invention,
a transparent electrode includes:
a substrate; and
a conductive metal layer on the substrate, wherein
the conductive metal layer has a thin metal wire and a plating layer covering the thin metal wire,
the transparent electrode further includes a transparent conductive layer on a surface of the substrate on a side on which the thin metal wire is formed, the transparent conductive layer covering the substrate and the conductive metal layer, and
the thin metal wire is formed using a metal nanoparticle ink or a metal complex ink.

3. The transparent electrode according to item 1 or 2, wherein the thin metal wire is formed using an inkjet parallel line drawing method.

4. The transparent electrode according to any one of items 1 to 3, wherein the transparent conductive layer contains a conductive polymer.

According to another aspect of the present application, a method for manufacturing a transparent electrode includes:
forming a thin metal wire on a substrate using a metal nanoparticle ink or a metal complex ink;
plating the thin metal wire; and
forming a transparent conductive layer on the plated thin metal wire and a surface of the substrate on a side on which the thin metal wire is formed.

According to another aspect of the present application, an organic electroluminescent element includes the transparent electrode.

The advantages and features provided by one or more embodiments of the invention will become more fully understood from the detailed description given hereinbelow and the appended drawings which are given by way of illustration only, and thus are not intended as a definition of the limits of the present invention.

Figure 1:
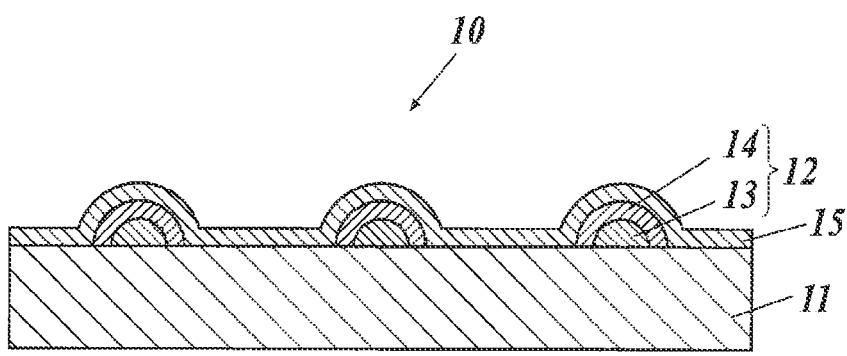
FIG. 1 is a schematic diagram showing the structure of a transparent electrode of the present invention.

Hereinafter, one or more embodiments of the present invention will be described with reference to the drawings. However, the scope of the invention is not limited to the disclosed embodiments.

EMBODIMENTS FOR CARRYING OUT THE INVENTION

A transparent electrode of the present invention is a transparent electrode including: a substrate; and a conductive metal layer on the substrate, wherein the conductive metal layer has a thin metal wire and a plating layer covering the thin metal wire, the transparent electrode further includes a transparent conductive layer on a surface of the substrate on a side on which the thin metal wire is formed, the transparent conductive layer covering the substrate and the conductive metal layer, and the thin metal wire is formed using a metal nanoparticle ink or a metal complex ink. This feature is a technical feature common to all the claims.

As an embodiment of the present invention, in terms of appearance of the effects of the present invention, preferably the thin metal wire is formed by printing.

As an embodiment of the present invention, because the conductive metal layer can be made thin, preferably the thin metal wire is formed using an inkjet parallel line drawing method.

As an embodiment of the present invention, in terms of appearance of the effects of the present invention, preferably the transparent conductive layer contains a conductive polymer.

As an embodiment of the present invention, in terms of appearance of the effects of the present invention, preferably the transparent conductive layer contains a metal oxide.

A method for manufacturing a transparent electrode, thereby manufacturing the transparent electrode of the present invention, includes: forming a thin metal wire on a substrate using a metal nanoparticle ink or a metal complex ink; plating the thin metal wire; and forming a transparent conductive layer on the plated thin metal wire and a surface of the substrate on a side on which the thin metal wire is formed. This can manufacture a transparent electrode having low resistance and high storability.

The transparent electrode of the present invention is suitably included in an organic electroluminescent element. This can provide an organic EL element having low resistance and high storability.

Advantageous effects of the embodiments can be to provide a transparent electrode having low resistance and high storability and a method for manufacturing the same, and to provide an organic electroluminescent element provided with the transparent electrode.

Although appearance mechanism or action mechanism of the effects of the present invention is not clear yet, it is conjectured as follows.

Because the embodiments can fill in fine spaces in the thin metal wires and can also reduce roughness by plating the thin metal wires, it can reduce the area of contact of the thin metal wires with the transparent conductive layer when formed and accordingly can prevent deterioration such as oxidation in the thin metal wires.

Hereinafter, the present invention is detailed. Note that, in this application, "- (to)" between numerical values is used to mean that the numerical values before and after the sign are inclusive as the lower limit and the upper limit. Further, preferred embodiments of the present invention may be carried out with appropriate changes as far as they do not depart from the scope of claims and the scope of their equivalents.

<<Structure of Transparent Electrode>>

A transparent electrode of the present invention is a transparent electrode including: a substrate; and a conductive metal layer on the substrate, wherein the conductive metal layer has a thin metal wire(s) and a plating layer covering the thin metal wire(s), the transparent electrode further includes a transparent conductive layer on the surface of the substrate on the side on which the thin metal wire(s) is formed, the transparent conductive layer covering the substrate and the conductive metal layer, and the thin metal wire(s) is formed using a metal nanoparticle ink or a metal complex ink.

FIG. 1 shows the structure (a cross-sectional view) of a transparent electrode of the present invention.

As shown in FIG. 1, a transparent electrode 10 has a conductive metal layer 12 (a thin metal wire(s) 13 and a plating layer 14) and a transparent conductive layer 15 on a substrate 11.

The conductive metal layer has the thin metal wire 13 and the plating layer 14 on the thin metal wire.

The transparent electrode further has the transparent conductive layer 15 covering the substrate and the plating layer on the surface of the substrate on the side on which the thin metal wire is formed.

Figure 2A:
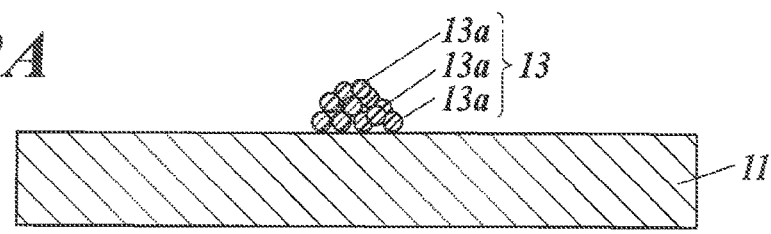
FIG. 2A is a schematic diagram of a thin metal wire formed of a nano-paste containing metal nanoparticles.
Figure 2B:
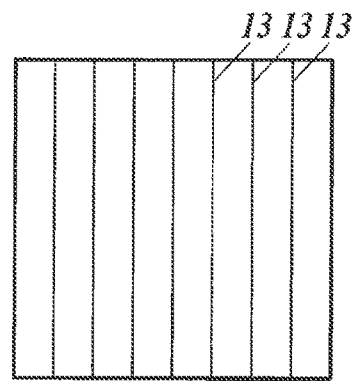
FIG. 2B is a schematic diagram of thin metal wires formed of a nano-paste containing metal nanoparticles.
Figure 2C:
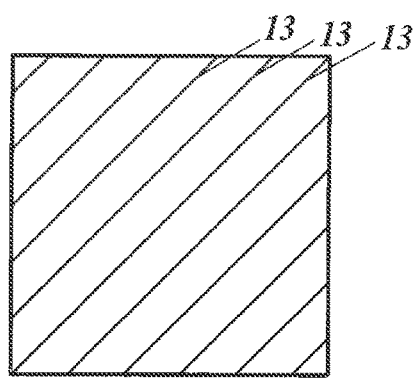
FIG. 2C is a schematic diagram of thin metal wires formed of a nano-paste containing metal nanoparticles.
Figure 2D:
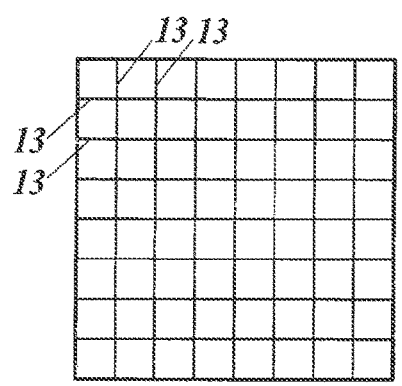
FIG. 2D is a schematic diagram of thin metal wires formed of a nano-paste containing metal nanoparticles.
Figure 2E:
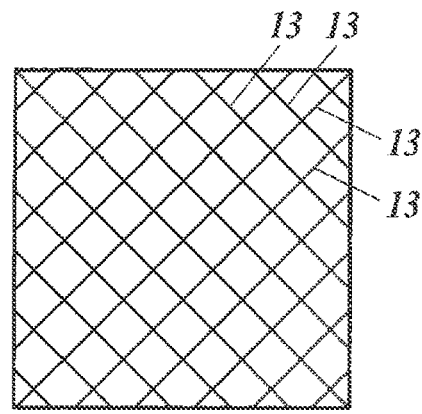
FIG. 2E is a schematic diagram of thin metal wires formed of a nano-paste containing metal nanoparticles.
Figure 2F:
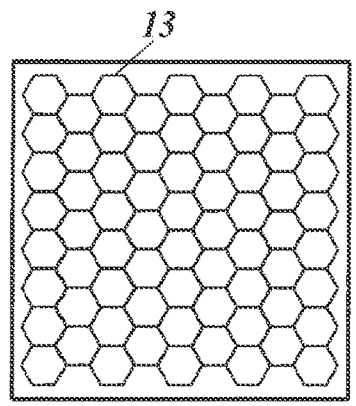
FIG. 2F is a schematic diagram of thin metal wires formed of a nano-paste containing metal nanoparticles.
Figure 2G:
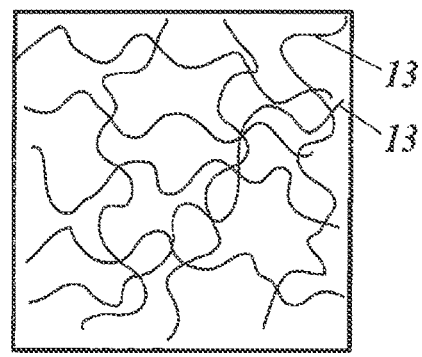
FIG. 2G is a schematic diagram of thin metal wires formed of a nano-paste containing metal nanoparticles.

The thin metal wire is formed using a metal nanoparticle ink as shown in FIG. 2A. FIG. 2A shows one thin metal wire formed using a metal nanoparticle ink 13a as an example, but can also be formed similarly using a metal complex ink.

[Substrate]

As the substrate 11, a transparent resin substrate having a total luminous transmittance in the visible light wavelength region of 80% or more determined by a method in conformity with JIS K 7361-1:1997 (Plastics—Determination of the Total Luminous Transmittance of Transparent Materials) is preferably used. One having a total luminous transmittance in the visible light wavelength region of 50% or more determined by a method in conformity with the above JIS standard is referred to as being transparent.

For the substrate 11, a material having excellent flexibility, a sufficiently small dielectric loss coefficient, and less absorption of microwaves than the conductive layer is preferable. As the substrate 11, it is preferable to use, for example, a transparent resin film in terms of productivity and properties such as lightness in weight and flexibility.

The transparent resin film usable by preference is not particularly limited, and can be suitably selected from among publicly-known ones in terms of material, shape, structure, thickness and so forth. Examples thereof include: polyester resin films of polyethylene terephthalate (PET), polyethylene naphthalate, modified polyester, etc.; polyethylene (PE) resin films; polypropylene (PP) resin films; polystyrene resin films; polyolefin resin films of cyclic olefin resin, etc.; vinyl resin films of polyvinyl chloride, polyvinylidene chloride, etc.; polyether ether ketone (PEEK) resin films; polysulfone (PSF) resin films; polyethersulfone (PES) resin films; polycarbonate (PC) resin films; polyamide resin films; polyimide resin films; acrylic resin films; and triacetylcellulose (TAC) resin films.

Any of the resin films having a total luminous transmittance of 80% or more can be preferably used as the substrate 11. In particular, in terms of transparency, infrared absorption, handleability, strength and costs, polyester resin films are preferable, and a biaxially oriented polyethylene terephthalate film and a biaxially oriented polyethylene naphthalate film are far preferable.

The substrate 11 can be surface-treated or provided with an easy adhesion layer in order to ensure wettability and adhesiveness of an application liquid. Publicly-known technologies are usable for the surface treatment and the easy adhesion layer. Examples of the surface treatment include surface activation treatments such as corona discharge treatment, flame treatment, ultraviolet treatment, high frequency treatment, glow discharge treatment, activated plasma treatment and laser treatment.

Examples of the easy adhesion layer include polyester, polyamide, polyurethane, vinyl copolymers, butadiene copolymers, acrylic copolymers, vinylidene copolymers and epoxy copolymers. The easy adhesion layer may be composed of a single layer or, in order to improve adhesiveness, may be composed of two or more layers. On the front side or the back side of the substrate 11, a gas barrier layer which is composed of a coating composed of an inorganic substance or an organic substance or a gas barrier layer which is composed of a hybrid coating composed of an inorganic substance and an organic substance is preferably formed.

[Conductive Metal Layer]

The conductive metal layer 12 is a layer having the thin metal wires 13 and the plating layer 14 on the thin metal wires.

It is also preferable to dispose a gas barrier layer between the substrate and the conductive metal layer. The gas barrier layer is described later.

[Thin Metal Wires]

The thin metal wires are formed on the substrate in a predetermined thin line pattern. The thin metal wires contain a metal nanoparticle ink or a metal complex ink.

Metal atom(s) contained in the metal nanoparticle ink or the metal complex ink is not particularly limited as far as it has conductivity. Examples thereof include metals such as gold, silver, copper, iron, cobalt, nickel and chromium, and alloys of these. In terms of conductivity, silver and copper are preferable, and silver is far preferable.

The metal nanoparticle ink is an ink containing metal nanoparticles, and may further contain a binder, a dispersant to disperse the metal nanoparticles, and/or the like, as needed.

The thin metal wires are formed on the substrate in a pattern having open parts so as to form a transparent electrode. The open parts are parts on the substrate the parts with no thin metal wire formed, and serve as translucent window parts.

The shape of the thin line pattern of the thin metal wires is not particularly limited. Preferable are, for example, a stripe pattern by which thin metal wires are striped, a lattice pattern by which thin metal wires are latticed, a hexagonal/honeycomb pattern by which thin metal wires are hexagonal/honeycomb, and a random network. In particular, in terms of small influence even if defects are generated in the thin metal wires, the lattice pattern, the honeycomb pattern and the random network are preferable, and the lattice pattern is most preferable. FIG. 2B to FIG. 2G are each a schematic diagram of a thin line pattern of thin metal wires on a substrate.

Examples of the method for forming thin metal wires in the stripe pattern or the lattice pattern include relief printing (letterpress), intaglio printing, screen printing and inkjet methods, thereby printing thin metal wires in a desired shape. Of the inkjet methods, printing using an inkjet parallel line drawing method is particularly preferable.

The inkjet parallel line drawing method is detailed later.

The open area ratio of the pattern of the thin metal wires is preferably 80% or more in terms of transparency. The open area ratio is a ratio of the translucent window parts, excluding the thin metal wires, which are not optically transparent, to the whole. For example, in the case where the thin metal wires are striped or latticed, the open area ratio of the stripe pattern having a line width of 100 μm and a line interval of 1 mm is about 90%.

The wire width of the thin metal wire(s) is preferably 10 to 200 μm. When the width of the thin metal wire(s) is 10 μm or more, a desired level of conductivity can be obtained, whereas when the width thereof is 200 μm or less, transparency can be prevented from decreasing. The height of the thin metal wire(s) is preferably 0.1 to 10 μm. When the height of the thin metal wire(s) is 0.1 μm or more, a desired level of conductivity can be obtained, whereas when the height thereof is 10 μm or less, current leakage and poor thickness distribution of a functional layer in forming an organic electronic device can be prevented from occurring.

The average particle size of the metal nanoparticles is preferably in a range from 1 to 100 nm, far preferably in a range from 1 to 50 nm and particularly preferably in a range from 1 to 30 nm.

The average particle size of the metal nanoparticles is obtained as follows: of metal nanoparticles observed under an electron microscope, 200 or more metal nanoparticles which are observable as circles, ovals, substantial circles or substantial ovals are observed at random; the particle size of each of the metal nanoparticles is obtained; and the number average value thereof is obtained. The particle size indicates the shortest distance among distances between two parallel lines between which the outer edge of a metal nanoparticle, which is observable as a circle, an oval, a substantial circle or a substantial oval, is sandwiched. When the average particle size is determined, the particle size which clearly represents a side face or the like of a metal nanoparticle is not included for the determination.

As a method for producing a dispersive substance containing metal nanoparticles, many proposals have been made and detailed, for example, in Japanese Patent Application Publication Nos. 2010-265543, 2011-68936, 2012-162767, 2012-144796, 2012-144795, 2012-52225, 2008-214591, 2007-200775, 2006-193594, 2012-119132 and 2011-153362 and Japanese Patent Application Publication (Translation of PCT Application) No. 2009-515023.

As the metal complex ink, any can be used as far as a metal forms a complex and is dispersed or dissolved in a solvent.

Examples of the solvent include ketocarboxylic acid, behenic acid, and stearic acid. Further, in Japanese Patent Application Publication (Translation of PCT Application) No. 2008-530001, a silver complex compound derived by reaction of a silver compound and an ammonium carbonate compound is cited.

Simultaneously, an amine compound may further be contained as a reductant.

A method for producing a metal complex ink is described, for example, in Japanese Patent Application Publication No. 2011-148759, Japanese Patent Application Publication (Translation of PCT Application) No. 2008-530001, and Japanese Patent Application Publication Nos. 2014-193991 and 2012-92299.

The random network structure can be formed, for example, by the method described in Japanese Patent Application Publication (Translation of PCT Application) No. 2005-530005, according to which a disordered network structure of conductive fine particles is spontaneously formed by application and drying of a liquid containing metal fine particles.

Surface resistivity of the substrate on which the thin metal wires are disposed is preferably 10Ω/sq. or less, preferably 5Ω/sq. or less, and, for the large area described above, far preferably 2Ω/sq. or less. The surface resistivity is measurable, for example, in conformity with JIS K 6911-2006, ASTM D257 or the like and is simply and easily measurable with a commercially-available surface resistivity meter.

It is preferable to carry out heat treatment on the thin metal wires within an extent of not damaging the film substrate. This is particularly preferable because metal nanoparticles or metal complexes are well fused with one another thereby, and conductivity of the thin metal wires increases.

As a method for the heat treatment, heating with an oven or heating with a hot plate, which is conventionally and generally carried out, can be used. Alternatively, local heat treatment may be used, and for that, flash pulse irradiation treatment, microwave treatment, plasma treatment, electron induction heating treatment, excimer laser irradiation treatment, ultraviolet treatment, infrared heater treatment, hot air heater treatment or the like can be used. As the heat treatment, heating with an oven or a hot plate and local heat treatment may be both carried out.

The thin metal wires may be provided with an under-layer in order to improve a pattern drawing property and adhesiveness to the base material. The under-layer is not particularly limited as far as it has optical transparency. For example, an under-layer containing organic particles of acrylic resin or inorganic particles of metal oxide may be used. These organic particles or inorganic particles may be used with a binder composed of organic or inorganic resin too.

Examples of the metal oxide include a variety of metal oxide containing a metal element selected from among magnesium, aluminum, silicon, titanium, zinc, yttrium, zirconium, molybdenum, tin, barium, tantalum and so forth. Further Examples thereof include carbide, nitride and boride. However, it is preferable that at least one type of transparent metal oxide be contained.

The composition of the under-layer is not particularly limited except that the layer is composed of inorganic compound mainly. For example, the composition described in Japanese Patent Application Publication No. 2007-169604 may also be preferably used.

(Inkjet Parallel Line Drawing Method)

Hereinafter, the inkjet parallel line drawing method is described with reference to FIGS. 3 to 6.

As a basic principle, a phenomenon to accumulate, in drying a liquid containing a functional material applied on a substrate, the functional material contained in the liquid at the edge parts of the liquid selectively can be utilized. This phenomenon may be called coffee ring phenomenon or coffee stain phenomenon. Since the method is not limited to one for forming a ring-shaped pattern, the phenomenon may be called "coffee stain phenomenon" in the following explanation.

FIG. 3 are schematic explanatory diagrams to conceptually explain an example of the method for forming a parallel line pattern, utilizing the basic principle.

In FIG. 3, "1" represents a base material, "2" represents a linear liquid containing a functional material, and "3" represents a coating formed by accumulating the functional material at the edges of the linear liquid 2 selectively (hereinafter, may be called "parallel line pattern"). Further, "H" represents an applier to apply a liquid onto the base material 1, and here constituted of a droplet discharge device. The droplet discharge device H can be constituted of, for example, an inkjet head(s) of an inkjet recording apparatus.

Figure 3A:
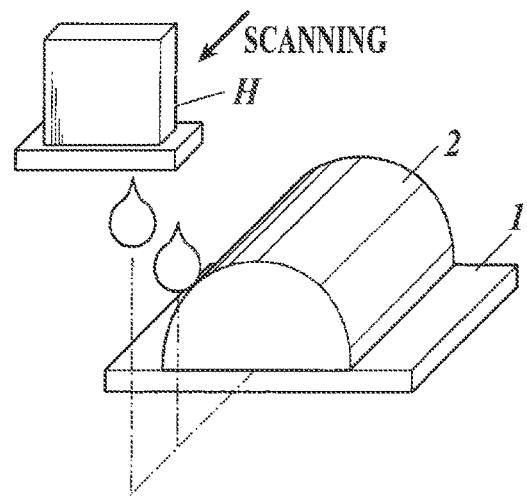
FIG. 3A is a schematic explanatory diagram to conceptually explain an example of a method for forming a parallel line pattern.

As shown in FIG. 3A, the droplet discharge device H discharges the liquid containing a functional material while the droplet discharge device H and the base material 1 scan relatively, and the droplets successively discharged are united on the base material, so that the linear liquid 2 containing the functional material is formed thereon.

Figure 3B:
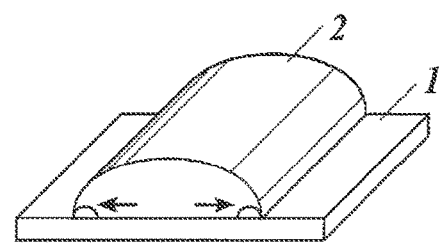
FIG. 3B is a schematic explanatory diagram to conceptually explain the example of the method for forming a parallel line pattern.

Then, as shown in FIG. 3B, in evaporating and drying the linear liquid 2, coffee stain phenomenon is utilized so that the functional material is accumulated at the edges of the linear liquid 2 selectively.

Coffee stain phenomenon can be made to occur by setting conditions for drying the linear liquid 2.

That is, the linear liquid 2 on the base material 1 is dried faster at the edges than at the center part, and with the progress of drying, the solid content concentration reaches the saturating concentration, and local precipitation of the solid content occurs at the edges of the linear liquid 2.

This precipitated solid content settles the edges of the linear liquid 2, and prevents the linear liquid 2 from contracting in the width direction, which would be caused by the ensuing drying. This effect allows the liquid of the linear liquid 2 to form a convention current from the center part to the edges so as to compensate for the liquid lost by evaporation at the edges.

Because this convention current results from the settlement of the contact lines of the linear liquid 2 following the drying and difference between the amounts of evaporation at the center part and the edges of the linear liquid 2, the convention current changes according to the solid content concentration, the contact angle of the linear liquid 2 and the base material 1, the amount of the linear liquid 2, heating temperature of the base material 1, arrangement density of the linear liquid 2 and/or environmental factors such as temperature, humidity and air pressure, and therefore can be controlled by adjusting these.

Figure 3C:
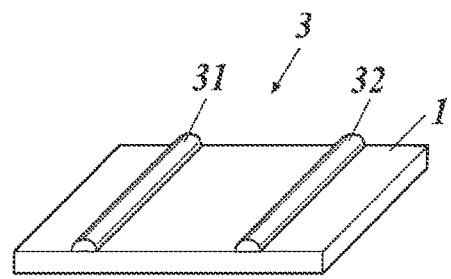
FIG. 3C is a schematic explanatory diagram to conceptually explain the example of the method for forming a parallel line pattern.

As a result of that, as shown in FIG. 3C, the parallel line pattern 3 constituted of thin lines containing the functional material is formed on the base material 1. The parallel line pattern 3 formed from one line of the linear liquid 2 is constituted of a pair of thin lines 31, 32.

By applying the above method for forming the parallel line pattern, a mesh functional pattern constituted of the parallel line patterns which intersect with one another can be formed.

This mesh functional pattern is effective in realizing distribution of the functional material on the base material in a state in which low visibility is maintained.

In particular, line segments constituting the parallel line pattern formed as described above can realize a line width of several μm. This fine line width allows the mesh functional pattern not to be recognized with eyes of a person and to look like transparent even when the functional material itself is not transparent.

The shape of the thin line pattern of the functional material can be set according to the device which uses the functional material. In a touch sensor(s) used in a touchscreen, which is an example of the device, a transparent surface electrode(s) is used to detect a point touched with a finger or the like.

If, in the mesh functional pattern, a conductive material is used as the functional material, the pattern is preferably applicable to the transparent surface electrode or the like for a touchscreen or the like. In order to constitute a surface electrode or the like, the mesh functional pattern of the parallel line patterns different from one another in the forming direction is very effective in increasing the number of conductive paths.

An example of the method for forming the mesh functional pattern is the following method.

FIG. 4 are explanatory diagrams to explain an example (reference example) of the method for forming a mesh functional pattern.

Figure 4A:
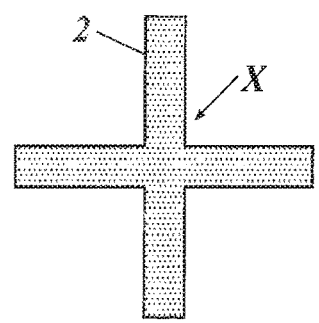
FIG. 4A is a schematic diagram to explain an example of a method for forming a mesh functional pattern.

First, as shown in FIG. 4A, the linear liquid 2 is applied onto the base material 1 in such a way as to be meshed. That is, the linear liquid 2 is applied such that lines intersect at a crossing part X.

Figure 4B:
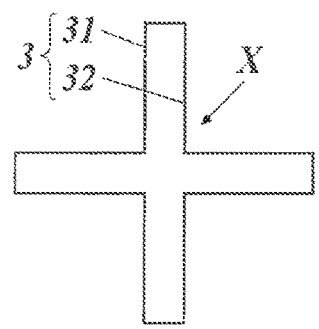
FIG. 4B is a schematic diagram to explain the example of the method for forming a mesh functional pattern.

Next, the linear liquid 2 is dried, so that the mesh pattern of the parallel line patterns 3 can be formed as shown in FIG. 4B.

At the time, as a result of accumulation of the functional material contained in the linear liquid 2 at the edges, the line segments 31, 32 are discontinued at the crossing part X at which the parallel lines in different directions intersect with one another.

An example of the method for preventing the line segments 31, 32 from being discontinued at the crossing part X is the following method.

FIG. 5 are explanatory diagrams to explain another example (reference example) of the method for forming a mesh functional pattern.

Figure 5A:
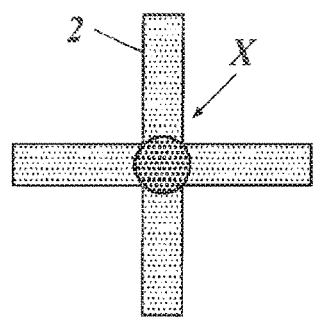
FIG. 5A is a schematic diagram to explain an example of the method for forming a mesh functional pattern.

In this example, as shown in FIG. 5A, in the method shown in FIG. 4, the ink amount at the part of an intersection point formed of the linear liquid 2 is set larger than that at the other part(s).

Figure 5B:
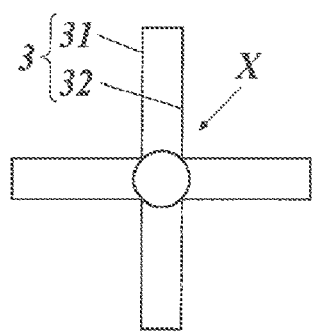
FIG. 5B is a schematic diagram to explain the example of the method for forming a mesh functional pattern.

As shown in FIG. 5B, this method can prevent the line segments 31, 32 from being discontinued at the crossing part X in the mesh pattern of the parallel line patterns 3.

At the time, because the ink amount to the crossing part X is increased, as shown in FIG. 5B, the crossing part X is ring-shaped and has a diameter larger than the distance between the line segments 31, 32.

Generating this ring-shaped part prevents the line segments 31, 32 from being discontinued, and is effective, for example, in making it easy to ensure conductivity. However, the ring-shaped part may be visible periodically, and it is understood that it has a limit in lower visibility.

Another example of the method for preventing the line segments 31, 32 from being discontinued at the crossing part X is the following method.

FIG. 6 are explanatory diagrams to explain another example of the method for forming a mesh functional pattern.

Figure 6A:
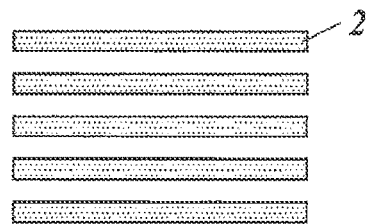
FIG. 6A is a schematic diagram to explain an example of the method for forming a mesh functional pattern.

First, as shown in FIG. 6A, the linear liquid 2 is applied in a first direction (the right-left direction in the figure).

Figure 6B:
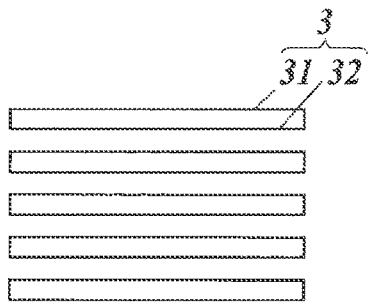
FIG. 6B is a schematic diagram to explain the example of the method for forming a mesh functional pattern.

In the step of drying this linear liquid 2, the functional material is accumulated at the edges selectively, so that first parallel line patterns 3 are formed as shown in FIG. 6B.

Figure 6C:
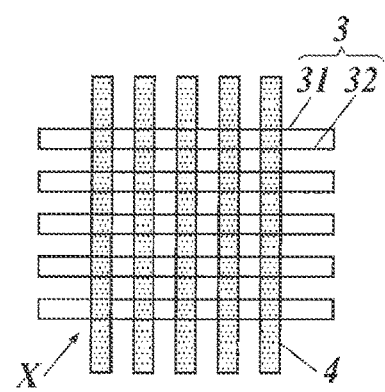
FIG. 6C is a schematic diagram to explain the example of the method for forming a mesh functional pattern.

Next, as shown in FIG. 6C, a second linear liquid 4 is applied in a second direction (in this example, the direction at right angles with the first direction, namely, the up-down direction in the figure) different from the first direction. That is, the second linear liquid 4 is applied in such a way as to intersect with the first parallel line patterns 3.

Figure 6D:
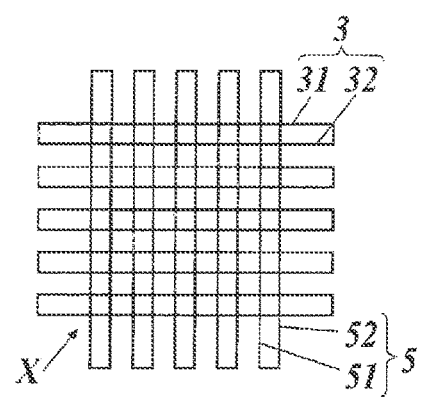
FIG. 6D is a schematic diagram to explain the example of the method for forming a mesh functional pattern.

In the step of drying this linear liquid 4, the functional material is accumulated at the edges selectively, so that second parallel line patterns 5 are formed as shown in FIG. 6D. The "51" and "52" represent line segments constituting each second parallel line pattern 5.

As described above, the mesh functional pattern constituted of the first parallel line patterns 3 and the second parallel line patterns 5 different from one another in the forming direction is formed.

This method can prevent the line segments 31, 32 and the line segments 51, 52 from being discontinued at the crossing parts X at which the parallel lines in different directions interest with one another.

[Plating Layer]

Figure 7:
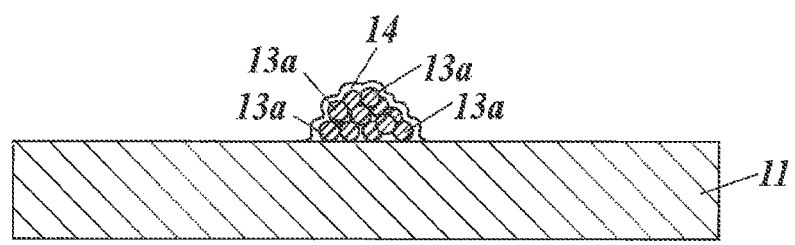
FIG. 7 is a schematic diagram showing a plated thin metal wire.

The plating layer 14 is formed on the thin metal wires, to be specific, formed to cover the thin metal wires (see FIG. 7). The thin metal wires being covered with the plating layer can smooth nano-order roughness caused by the metal nanoparticles or metal complexes constituting the metal thin wires.

Here, the smoothness is a value expressed by surface roughness stipulated in JIS B 0601-2013, and the total height of profile Rt (p) is preferably 500 nm or less, preferably 200 nm or less, and most preferably 100 nm. More smoothness can make a yield of elements and continuous driving performance higher.

The surface roughness is, to be specific, roughness relevant to the amplitude of microscopic roughness measured with an AFM (atomic force microscope). This surface roughness can be calculated as follows: carry out measurement a large number of times in a section of several ten μm with a detector of AFM, the detector having a sensing pin, the tip of which has an extremely small radius; and calculate the surface roughness from a profile curve of the roughness continuously measured.

As a method for plating, there is a method of, after thin metal wires are formed on a substrate, applying a plating agent thereto in a desired shape by relief printing, intaglio printing, screen printing or the inkjet method(s), thereby plating the thin metal wires.

As the plating agent, for example, one in which plating nuclei, to be specific, conductive substance(s), are dispersed or the like in a solvent can be used.

Usable examples of the conductive substance as the plating nuclei include transition metals and their compounds. Of these, ionic transition metals are preferably used. For example, transition metals such as copper, silver, gold, nickel, palladium, platinum and cobalt are preferably used, and silver, gold and copper are far preferably used because they can form a conductive pattern which has low electric resistance and is resistant to corrosion.

As the conductive substance, it is preferable to use a particulate one having an average particle size of about 1 to 50 nm. This average particle size means the median particle diameter (D50), and is a value determined with a laser diffraction/scattering particle size distribution analyzer.

The content of the conductive substance such as metal to the total conductive ink is preferably in a range from 10 to 60 mass %.

As the plating agent, in addition to the above conductive substance, one or more types of oxides of the above metals and the metals surface-coated with organic substances and so forth can be used.

The metal oxides are normally in an inactive (insulating) state, but can be active (conductive), for example, by being treated with a reductant such as dimethylamine borane so as to expose the metals.

Examples of the metals surface-coated with organic substances include one composed of a metal in resin particles (organic substance) formed by emulsion polymerization or the like. These are normally in an inactive (insulating) state, but can be active (conductive), for example, by removing the organic substances with a laser or the like so as to expose the metals.

Further, examples of the solvent used for the plating agent include an aqueous medium usable for the conductive ink. Examples of the aqueous medium usable as the solvent include water, an organic solvent miscible with water, and a mixture of these. Examples of the organic solvent miscible with water include: alcohols such as methanol, ethanol, n-propanol and isopropanol; ketones such as acetone and methyl-ethyl-ketone; polyalkylene glycols such as ethylene glycol, diethylene glycol and propylene glycol; alkyl ether of polyalkylene glycol; and lactams such as N-methyl-2-pyrrolidone. In the present invention, only water may be used, a mixture of water and an organic solvent miscible with water may be used, or only an organic solvent miscible with water may be used. In terms of safety and a load on the environment, only water or a mixture of water and an organic solvent miscible with water is preferable, and only water is particularly preferable.

Examples of the organic solvent usable as the solvent include: ketones such as acetone and methyl-ethyl-ketone; ethers such as tetrahydrofuran and dioxane; ester acetates such as ethyl acetate and butyl acetate; nitriles such as acetonitrile; and amides such as dimethylformamide and N-methylpyrrolidone. These can be used individually, or two or more types thereof can be used. Equivalents to these can also be used.

The step of electroless plating is a step for forming an electroless plating coating composed of a metal coating by making an electroless plating liquid contact the surface of the thin metal wires supporting the plating nuclei such as palladium or silver, thereby precipitating the metal such as copper contained in the electroless plating liquid.

As the electroless plating liquid, for example, one containing: a conductive substance composed of metal such as copper, nickel, chromium, cobalt or tin; a reductant; an aqueous medium; and a solvent such as an organic solvent can be used.

Usable examples of the reductant include dimethylamino borane, phosphinic acid, sodium phosphinate, dimethylamine borane, hydrazine, formaldehyde, sodium borohydride and phenols.

The electroless plating liquid may contain a complexing agent as needed. Examples thereof include: organic acids including: monocarboxylic acids such as acetic acid and formic acid; dicarboxylic acids such as malonic acid, succinic acid, adipic acid, maleic acid and fumaric acid; hydroxycarboxylic acids such as malic acid, lactic acid, glycolic acid, gluconic acid and citric acid; amino acids such as glycine, alanine, iminodiacetic acid, arginine, aspartic acid and glutamic acid; amino polycarboxylic acids such as iminodiacetic acid, nitrilotriacetic acid, ethylenediaminediacetic acid, ethylenediaminetetraacetic acid and diethylenetriaminepentaacetic acid; soluble salts (sodium, potassium salt, ammonium salt, etc.) of these organic acids; and amines including ethylenediamine, diethylenetriamine and triethylenetetramine.

The temperature of the electroless plating liquid in making the electroless plating liquid contact the surface of the thin metal wires supporting the plating nuclei in the plating agent is preferably in a range from about 20° C. to 98° C.

Further, the step of electrolytic plating is a step for forming an electrolytic plating coating (a metal coating) by energization in a state in which an electrolytic plating liquid contacts the surface of the thin metal wires supporting the plating nuclei or the surface of the electroless plating coating formed by the electroless plating, thereby precipitating the metal such as copper contained in the electrolytic plating liquid on the surface of the thin metal wires set to the negative pole or the surface of the electroless plating coating formed by the electroless plating.

As the electrolytic plating liquid, one containing: a conductive substance composed of metal such as copper, nickel, chromium, cobalt or tin; sulfuric acid or the like; and an aqueous medium can be used.

The temperature of the electrolytic plating liquid in making the electrolytic plating liquid contact the surface of the thin metal wires supporting the plating nuclei in the plating agent is preferably in a range from about 20° C. to 98° C.

[Transparent Conductive Layer]

The transparent conductive layer 15 is formed on the substrate in such a way as to cover the thin metal wires and the plating layer.

The transparent conductive layer contains at least a material having conductivity (conductive material). Examples of the conductive material include a transparent conductive material and a conductive polymer. The "conductive" of the transparent conductive layer 15 and the conductive material means a state in which electricity flows and means that sheet resistance measured by a method in conformity with HS K 7194-1994, "Testing Method for Resistivity of Conductive Plastics with a Four-Point Probe Array", is less than $10 \times 7\Omega$/sq.

The electric resistance of the transparent conductive layer is, in surface resistivity, preferably $10,000\Omega$/sq. or less, far preferably $2,000$ $\Omega$/sq. or less, and most preferably $500\Omega$/sq. or less in order to make electric potentials between the thin metal wires uniform.

The dry thickness of the transparent conductive layer is preferably 30 to 2,000 nm. The dry thickness thereof is far preferably 1,000 nm or less in terms of transparency while far preferably 100 nm or more in terms of conductivity and still far preferably 200 nm or more in terms of surface smoothness of an electrode.

As the transparent conductive material, a metal oxide, a conductive polymer or the like can be used. In terms of transparency, a metal oxide is preferable, whereas in terms of coating of roughness, a conductive polymer is preferable.

The transparent conductive material may be preferably a metal oxide. Examples thereof include: conductive oxides such as indium tin oxide (ITO), zinc oxide (ZnO), tin oxide ($SnO_2$) and IGZO; and amorphous transparent conductive films of indium zinc oxide and so forth.

Of the metal oxides, amorphous transparent conductive films are preferable, and indium zinc oxide and amorphous indium tin oxide are preferable. A method(s) for producing amorphous indium tin oxide is described in Japanese Patent Application Publication Nos. H10-280127 and 2003-73860.

If the transparent conductive layer is formed of a conductive polymer, it is preferable to contain both a conductive polymer and a nonconductive polymer. The transparent conductive layer containing: a conductive polymer; and a nonconductive polymer containing a self-dispersing polymer and/or a hydroxy group-containing polymer can reduce a necessary amount of the conductive polymer without reducing conductivity of the transparent conductive layer. Consequently, a transparent electrode having both high conductivity and high transparency can be obtained.

(Conductive Polymer)

The conductive polymer contains a π-conjugated conductive polymer and a polyanion. The conductive polymer can be easily produced by subjecting the below-described precursor monomer(s) for forming the π-conjugated conductive polymer to chemical oxidative polymerization under the presence of an appropriate oxidizer, an appropriate oxidation catalyst and the polyanion described below.

(π-Conjugated Conductive Polymer)

The π-conjugated conductive polymer is not particularly limited, and usable examples thereof include chain conductive polymers such as polythiophenes (including simple polythiophene, the same applies to the following), polypyrrols, polyindoles, polycarbazoles, polyanilines, polyacetylenes, polyfurans, polyparaphenylene vinylenes, polyazulenes, polyparaphenylenes, polyparaphenylene sulfides, polyisothianaphthenes and polythiazyls. Of these, in terms of conductivity, transparency, stability and so forth, polythiophenes and polyanilines are preferable, and polyethylene dioxythiophene is the most preferable.

(Precursor Monomer for π-Conjugated Conductive Polymer)

The precursor monomer used for forming the π-conjugated conductive polymer has a π-conjugated system in the molecule, and when the precursor monomer is polymerized by the action of an appropriate oxidizer too, the π-conjugated system is formed in the principal chain. Examples thereof include pyrroles and derivatives thereof, thiophenes and derivatives thereof, and anilines and derivatives thereof.

Specific examples of the precursor monomer include pyrrole, 3-methylpyrrole, 3-ethylpyrrole, 3-n-propylpyrrole, 3-butylpyrrole, 3-octylpyrrole, 3-decylpyrrole, 3-dodecylpyrrole, 3,4-dimethylpyrrole, 3,4-dibutylpyrrole, 3-carboxylpyrrole, 3-methyl-4-carboxylpyrrole, 3-methyl-4-carboxyethylpyrrole, 3-methyl-4-carboxybutylpyrrole, 3-hydroxypyrrole, 3-methoxypyrrole, 3-ethoxypyrrole, 3-butoxypyrrole, 3-hexyloxypyrrole, 3-methyl-4-hexyloxypyrrole, thiophene, 3-methylthiophene, 3-ethylthiophene, 3-propylthiophene, 3-butylthiophene, 3-hexylthiophene, 3-heptylthiophene, 3-octylthiophene, 3-decylthiophene, 3-dodecylthiophene, 3-octadecylthiophene, 3-bromothiophene, 3-chlorothiophene, 3-iodothiophene, 3-cyanothiophene, 3-phenylthiophene, 3,4-dimethylthiophene, 3,4-dibutylthiophene, 3-hydroxythiophene, 3-methoxythiophene, 3-ethoxythiophene, 3-butoxythiophene, 3-hexyloxythiophene, 3-heptyloxythiophene, 3-octyloxythiophene, 3-decyloxythiophene, 3-dodecyloxythiophene, 3-octadecyloxythiophene, 3,4-dihydroxythiophene, 3,4-dimethoxythiophene, 3,4-diethoxythiophene, 3,4-dipropoxythiophene, 3,4-dibutoxythiophene, 3,4-dihexyloxythiophene, 3,4-diheptyloxythiophene, 3,4-dioctyloxythiophene, 3,4-didecyloxythiophene, 3,4-didodecyloxythiophene, 3,4-ethylene dioxythiophene, 3,4-propylene dioxythiophene, 3,4-butene dioxythiophene, 3-methyl-4-methoxythiophene, 3-methyl-4-ethoxythiophene, 3-carboxythiophene, 3-methyl-4-carboxythiophene, 3-methyl-4-carboxyethylthiophene, 3-methyl-4-carboxybutylthiophene, aniline, 2-methylaniline, 3-isobutylaniline, 2-aniline sulfonic acid and 3-aniline sulfonic acid.

(Polyanion)

The polyanion used for the conductive polymer is exemplified by: substituted or non-substituted polyalkylene; substituted or non-substituted polyalkenylene; substituted or non-substituted polyimide; substituted or non-substituted polyamide; substituted or non-substituted polyester; and copolymers thereof, and is composed of a structural unit having an anionic group and a structural unit having no anionic group.

The polyanion is a polymer to dissolve or disperse the π-conjugated conductive polymer in a solvent. The anionic group of the polyanion functions as a dopant for the π-conjugated conductive polymer and improves conductivity and heat resistance of the π-conjugated conductive polymer.

The anionic group of the polyanion is any functional group with which the π-conjugated conductive polymer can be doped by chemical oxidation. In particular, a monosubstituted sulfuric acid ester group, a monosubstituted phosphoric acid ester group, a phosphoric acid group, a carboxy group, a sulfo group and so forth are preferable in terms of easiness in producing and stability. In terms of the doping effect of the functional group on the π-conjugated conductive polymer, a sulfo group, a monosubstituted sulfuric acid ester group and a carboxy group are far preferable.

Specific examples of the polyanion include polyvinylsulfonic acid, polystyrenesulfonic acid, polyallylsulfonic acid, polyacrylic acid ethylsulfonic acid, polyacrylic acid butylsulfonic acid, poly-2-acrylamide-2-methylpropanesulfonic acid, polyisoprenesulfonic acid, polyvinylcarboxylic acid, polystyrenecarboxylic acid, polyallylcarboxylic acid, polyacrylcarboxylic acid, polymethacrylcarboxylic acid, poly-2-acrylamide-2-methylpropanecarboxylic acid, polyisoprenecarboxylic acid and polyacrylic acid. The polyanion may be a homopolymer of any of these or a copolymer composed of two or more types of these.

The polyanion may further contain fluorine atom in the compound. Specific examples thereof include Nafion (manufactured by DuPont K. K.) containing a perfluorosulfonic acid group and Flemion (manufactured by Asahi Glass Co., Ltd.) composed of perfluorovinyl ether containing a carboxylic acid group. These fluorinated polyanions can each form a transparent electrode provided with a positive hole injection function by being used in combination with a non-fluorinated polyanion, which is desired in terms of element efficiency and productivity.

Degree of polymerization of the polyanion is preferably in a range from 10 to 100,000 in the number of monomer units and, in terms of dissolubility in a solvent and conductivity, far preferably in a range from 50 to 10,000 in the number of monomer units.

A method for producing the polyanion is exemplified by: a method of, using acid, direct introduction of an anionic group into a polymer having no anionic group; a method of, using a sulfonating agent, sulfonation of a polymer having no anionic group; and a method of polymerization of an anionic group-containing polymerizable monomer(s).

The method of polymerization of the anionic group-containing polymerizable monomer is exemplified by a method of subjecting, in a solvent, anionic group-containing polymerizable monomers to oxidative polymerization or radical polymerization under the presence of an oxidizer and/or a polymerization catalyst.

More specifically, a predetermined amount of anionic group-containing polymerizable monomers is dissolved into a solvent, the resulting product is kept at a constant temperature, and a solution in which a predetermined amount of an oxidizer and/or a polymerization catalyst is dissolved into a solvent in advance is added thereto and reacts therewith for a predetermined time. The polymer produced by the reaction is adjusted to be a certain concentration using a solvent. In this production method, the anionic group-containing polymerizable monomer may be copolymerized with a polymerizable monomer(s) containing no anionic group.

The oxidizer, oxidization catalyst and solvent used in polymerization of the anionic group-containing polymerizable monomer are the same as those used in polymerization of the precursor monomer for forming the π-conjugated conductive polymer.

If the produced polymer is polyanionic salt, it is preferable to denature polyanionic salt to polyanionic acid. A method for denaturing polyanionic salt to polyanionic acid is exemplified by: ion exchange using ion exchange resin; dialysis; and ultrafiltration. Of these, ultrafiltration is preferable in terms of easiness in work.

The ratio of the π-conjugated conductive polymer to the polyanion contained in the conductive polymer, namely, "π-conjugated conductive polymer":"polyanion", in mass ratio is preferably in a range from 1:1 to 1:20 and, in terms of conductivity and dispersibility, far preferably in a range from 1:2 to 1:10.

The oxidizer, which is used in subjecting the precursor monomer for forming the n-conjugated conductive polymer to chemical oxidative polymerization under the presence of the polyanion so as to produce the conductive polymer, is any of oxidizers which are suitable for oxidative polymerization of pyrrole and mentioned in J. Am. Chem. Soc., Vol. 85, p. 454 (1963), for example.

For practical reasons, it is preferable to use an inexpensive and easily handleable oxidizer, and examples thereof include: iron (III) salts such as $FeCl_3$, $Fe(ClO_4)_3$, and iron (III) salt of organic acid or inorganic acid containing organic residue; hydrogen peroxide; potassium dichromate; alkali persulfate (potassium persulfate, sodium persulfate, etc.); ammonium; alkali perborate; potassium permanganate; and copper salt such as copper tetrafluoroborate.

In addition, air and oxygen under the presence of a catalytic amount of metal ion such as iron ion, cobalt ion, nickel ion, molybdenum ion or vanadium ion can be used as the oxidizer as needed. Using persulfate or iron (III) salt of organic acid or inorganic acid containing organic residue has a great practical advantage because of its non-corrosiveness.

Examples of the iron (III) salt of inorganic acid containing organic residue include iron (III) salts, namely, Fe (III) salts, of: alkanol sulfuric acid half-ester having 1 to 20 carbon atoms such as lauryl sulfate; alkylsulfonic acid having 1 to 20 carbon atoms such as methane sulfonic acid or dodecane sulfonic acid; aliphatic carboxylic acid having 1 to 20 carbon atoms such as 2-ethylhexylcarboxylic acid; aliphatic perfluorocarboxylic acid such as trifluoroacetic acid or perfluorooctanoic acid; aliphatic dicarboxylic acid such as oxalic acid; and optionally-alkyl-substituted aromatic sulfonic acid having 1 to 20 carbon atoms such as benzenesulfonic acid; p-toluenesulfonic acid; and dodecylbenzene sulfonic acid.

For this sort of conductive polymer, a commercially-available material can also be preferably used.

For example, a conductive polymer (abbreviated as PEDOT/PSS) composed of poly(3,4-ethylene dioxythiophene) and polystyrenesulfonic acid is commercially available from Heraeus as Clevios Series, from Aldrich as PEDOT-PSS 483095 and 560596, and from Nagase ChemteX Corporation as Denatron Series. In addition, polyaniline is commercially available from Nissan Chemical Industries, Ltd. as ORMECON Series.

(Nonconductive Polymer)

Examples of the nonconductive polymer include a self-dispersing nonconductive polymer and a hydroxy group-containing polymer.

(Self-Dispersing Nonconductive Polymer)

The self-dispersing nonconductive polymer is a self-dispersing polymer being dispersible in an aqueous solvent, containing a dissociable group and having a glass transition temperature of 25° C. or more and 150° C. or less. The dissociable group-containing self-dispersing polymer dispersible in an aqueous solvent does not contain a surfactant, an emulsifier and so forth which assist micelle formation, but is dispersible by itself in an aqueous solvent. The "dispersible in an aqueous solvent" means that colloidal particles composed of binder resin are dispersed in an aqueous solvent without being aggregated.

The used amount of the dissociable group-containing self-dispersing polymer is, to the conductive polymer, preferably 50 to 1,000 percent by mass, far preferably 100 to 900 percent by mass and still far preferably 200 to 800 percent by mass.

The size of colloidal particles is around 0.001 to 1 μm (1 to 1,000 nm) in general. The size of colloidal particles is preferably 3 to 500 nm, far preferably 5 to 300 nm and still far preferably 10 to 200 nm. With respect to the above colloidal particles, measurement thereof can be carried out with a light scattering photometer.

The aqueous solvent includes not only pure water (distilled water and deionized water included) but also an aqueous solution containing acid, alkali, salt or the like; a water-containing organic solvent; and a hydrophilic organic solvent. Examples of the aqueous solvent include pure water (distilled water and deionized water included); alcoholic solvents such as methanol and ethanol; and a mixed solvent of water and alcohol.

pH of the dispersion of the dissociable group-containing self-dispersing polymer used for manufacturing a transparent electrode is desired to be in a range in which the dispersion does not separate from the conductive polymer solution, which is compatibilized with the dispersion later, preferably in a range from 0.1 to 11.0 and far preferably in a range from 3.0 to 9.0.

The dissociable group-containing self-dispersing polymer is preferably transparent. The dissociable group-containing self-dispersing polymer is not particularly limited as far as it is a medium which forms a film. It is not particularly limited as far as it does not bleed out to the transparent electrode surface and does not influence an organic functional layer(s) or the like when an electronic device such as an organic EL element is manufactured. It is preferable that the dispersion of the self-dispersing polymer do not contain, for example, a surfactant (emulsifier) or a plasticizer which controls a film forming temperature.

The glass transition temperature (Tg) of the dissociable group-containing self-dispersing polymer is 25° C. or more and 150° C. or less, preferably in a range of 30° C. to 110° C.

The glass transition temperature being 25° C. or more improves a film forming property of coatings and surface smoothness of transparent electrodes, and hence prevents degradation of performance of elements due to deformation of coatings in an environmental test of transparent electrodes and/or electronic devices such as organic EL elements carried out at a high temperature. Further, the glass transition temperature being 150° C. or less improves homogeneity and surface smoothness of the transparent conductive layer, which is composed of the conductive polymer and the self-dispersing polymer, and improves performance of elements.

The glass transition temperature is measured at a temperature rise rate of 10° C./min with a differential scanning calorimeter (Model DSC-7 manufactured by PerkinElmer Inc.) in conformity with JIS K 7121-1987.

The dissociable group used for the dissociable group-containing self-dispersing polymer is not particularly limited to but includes anionic groups (sulfonic acid and salt thereof, carboxylic acid and salt thereof, phosphoric acid and salt thereof, etc.) and cationic groups (ammonium salt, etc.). The dissociable group is preferably an anionic group in terms of compatibility with the conductive polymer solution.

The amount of the dissociable group may be any as far as the self-dispersing polymer is dispersible in an aqueous solvent, preferably an amount as small as possible in terms of process adequacy so that a drying load is reduced. A counter species used for an anionic group or a cationic group is not particularly limited, but it is preferably hydrophobic and exists at a small amount in terms of performance of transparent electrodes and/or organic EL elements when the transparent electrodes and/or the organic EL elements are stacked.

Examples of the principal skeleton of the dissociable group-containing self-dispersing polymer include polyethylene, polyethylene-polyvinyl alcohol (PVA), polyethylene-polyvinyl acetate, polyethylene-polyurethane, polybutadiene, polybutadiene-polystyrene, polyamide (nylon), polyvinylidene chloride, polyester, polyacrylate, polyacrylate-poly ester, polyacrylate-polystyrene, polyvinyl acetate, polyurethane-polycarbonate, polyurethane-polyether, polyurethane-polyester, polyurethane-polyacrylate, silicone, silicone-polyurethane, silicone-polyacrylate, polyvinylidene fluoride-polyacrylate and polyfluoroolefin-polyvinyl ether. Further examples thereof include copolymers composed of these skeletons as the base and other monomer used thereon. Of these, polyester resin emulsion and polyester-acrylic resin emulsion each having the ester skeleton, acrylic resin emulsion having the acrylic skeleton, and polyethylene resin emulsion having the ethylene skeleton are preferable.

Commercially-available products usable include: Yodosol AD-176 and AD-137 (acrylic resin, manufactured by Henkel Japan Ltd.); Vylonal MD-1200, MD-1245 and MD-1500 (polyester resin, manufactured by Toyobo Co., Ltd.); and PLAS COAT RZ570, PLAS COAT Z561, PLAS COAT Z565, PLAS COAT Z687 and PLAS COAT Z690 (polyester resin, manufactured by Goo Chemical Co., Ltd.). The dispersions of the above dissociable group-containing self-dispersing polymers each dispersible in an aqueous solvent can be used individually or in combination.

(Hydroxy Group-Containing Polymer)

The hydroxy group-containing polymer is a polymer having a hydroxy group. The ratio of the hydroxy group-containing polymer to the conductive polymer of the transparent conductive layer is, to 100 parts by mass of the conductive polymer, preferably 30 parts by mass to 900 parts by mass of the hydroxy group-containing polymer and, in terms of current leakage prevention and transparency, far preferably 100 parts by mass or more of the hydroxy group-containing polymer.

The hydroxy group-containing polymer preferably has absorption of an absorbance of 0.1 or more at 2.5 to 3.0 μm. Here, the absorbance is an absorbance of a sample when the sample is applied onto a substrate in such a way as to be a thickness to use. Having an absorption region around 3.0 μm, which is mainly used in infrared rays that are used in the drying step, makes it easy to remove the solvent from the coating for forming the transparent conductive layer 15.

Further, having absorption at a wavelength region different from that of the resin film constituting the substrate 11 makes it possible to selectively use a wavelength which hardly damages the substrate 11.

[Gas Barrier Layer]

In a transparent electrode, if a small amount of moisture or oxygen enters its conductive layer, its performance decreases, for example, its resistance increases. Further, if this transparent electrode is applied to the below-described organic EL element, and a small amount of moisture or oxygen enters the organic EL element, its performance readily decreases. It is effective to form, on the transparent resin substrate, a gas barrier layer having a high shielding property against moisture and oxygen in order to prevent moisture and oxygen from diffusing into the element through the transparent resin substrate.

As the gas barrier property of the gas barrier layer, it is preferable that a water vapor permeability (25±0.5° C. and a relative humidity of (90±2)%) determined by a method in conformity with JIS K 7129-1992 be $1 \times 10^{-3}$ g/(m$^2$·24 h) or less, and far preferable that an oxygen permeability determined by a method in conformity with JIS K 7126-1987 be $1 \times 10^{-3}$ mL/m$^2$·24 h·atm or less.

The composition, structure and forming method of the gas barrier layer are not particularly limited. For example, a film containing an inorganic compound such as silica and formed by vacuum deposition or CVD can be used.

Alternatively, for example, a film formed by applying and drying an application liquid containing a polysilazane compound and then carrying out oxidation by ultraviolet irradiation under a nitrogen atmosphere containing oxygen and water vapor can be used. Before the gas barrier layer is formed, pretreatment may be carried out on the surface of the transparent resin substrate with a silane coupling agent or the like in order to improve adhesiveness to the transparent resin substrate.

The gas barrier layer may be composed of a single layer or have a multilayer structure composed of two or more layers. In the case where the gas barrier layer has the multilayer structure, the multilayer structure may be composed of an inorganic compound or formed as a hybrid coating composed of an inorganic compound and an organic compound. Further, a stress relief layer may be inserted into the gas barrier layer.

Regardless of a single layer or layers stacked, the thickness of one gas barrier layer is preferably 30 nm to 1,000 nm, far preferably 30 nm to 500 nm and particularly preferably 90 nm to 500 nm. When the thickness is 30 nm or more, thickness uniformity is excellent, and an excellent barrier property is obtained, whereas when the thickness is 1,000 nm or less, it hardly happens that cracks are suddenly made by bending, and the internal stress in film forming is kept from increasing, so that defects can be prevented from being generated.

As the method for applying the polysilazane compound, an appropriate method can be selected. Examples of the applying method include various types of printing such as roller coating, bar coating, dip coating, spin coating, casting, die coating, blade coating, curtain coating, spray coating and doctor coating, and various types of coating such as gravure printing, flexographic printing, offset printing, screen printing and inkjet printing. In the case where the gas barrier layer is preferably formed in a pattern, gravure printing, flexographic printing, offset printing, screen printing and inkjet printing are preferable.

The polysilazane used in the gas barrier layer is a polymer having a silicon-nitrogen bond and is a ceramic precursor inorganic polymer exemplified by $SiO_2$, $Si_3N_4$ and their intermediate solid solution $SiO_xN_y$ composed of Si—N, Si—H, N—H and/or the like.

In the case where a resin substrate is used, as described in Japanese Patent Application Publication No. 8-112879, one which is modified to silica by becoming ceramic at a relatively low temperature is preferable, and one represented by the following General Formula (1) can be preferably used.

[Chem. 1]

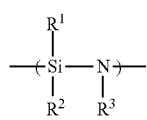

General Formula (1)

In General Formula (1), $R^1$, $R^2$ and $R^3$ each represent a hydrogen atom, an alkyl group, an alkenyl group, a cycloalkyl group, an aryl group, an alkylsilyl group, an alkylamino group or an alkoxy group.

For perhydropolysilazane, $R^1$, $R^2$ and $R^3$ are all hydrogen atoms, and for organopolysilazane, at least one of $R^1$, $R^2$ and $R^3$ is an alkyl group, an alkenyl group, a cycloalkyl group, an aryl group, an alkylsilyl group, an alkylamino group or an alkoxy group. In terms of compactness as the gas barrier layer to be obtained, perhydropolysilazane, for which R', $R^2$ and $R^3$ are all hydrogen atoms, is particularly preferable.

[Method for Manufacturing Transparent Electrode]

The method for manufacturing a transparent electrode has: a step of forming a thin metal wire(s) on a substrate using a metal nanoparticle ink or a metal complex ink; a step of plating the thin metal wire(s); and a step of forming a transparent conductive layer on the plated thin metal wire(s) and the surface of the substrate on the side on which the thin metal wire(s) is formed.

If a gas barrier layer is provided, the step of forming a gas barrier layer described above can be applied thereto. To the step of forming a thin metal wire(s), the above method can be applied.

The step of forming the transparent conductive layer 15 has a preparing step of preparing an application liquid for forming a transparent conductive layer, an applying step of forming a coating using the prepared application liquid, and a drying step of drying the formed coating.

[Preparation of Application Liquid]

First, in the step of forming a transparent conductive layer, an application liquid containing a conductive material is prepared. For example, an application liquid composed of fine particles of the above transparent conductive material dispersed in a solvent or an application liquid composed of the above conductive polymer and nonconductive polymer dispersed in a solvent is prepared. The solvent contains the above aqueous solvent and a high boiling point solvent. It is preferable to contain the below-described polar solvent.

(Aqueous Solvent)

As the aqueous solvent, an aqueous solvent which disperses the above dissociable group-containing self-dispersing polymer can be used. Examples thereof include water (distilled water and deionized water included); alcoholic solvents such as methanol and ethanol; and a mixed solvent of water and alcohol; an aqueous solution containing acid, alkali, salt or the like; a water-containing organic solvent; and a hydrophilic organic solvent.

(High Boiling Point Solvent)

The application liquid for forming the transparent conductive layer contains a high boiling point solvent, the boiling point of which is higher than that of an aqueous solvent. Containing the high boiling point solvent can effectively reduce surface tension of the application liquid without reducing dispersion stability of the conductive polymer in the application liquid and achieve necessary and sufficient wettability thereof on the substrate, and also achieve a stable discharge property of the application liquid when applied by the inkjet method.

As the high boiling point solvent, glycol ether is preferably used. It is preferable that glycol ether be water-soluble and have a surface tension of 40 mN/m or less, preferably 35 mN/m or less and far preferably 30 mN/m or less.

The added amount of the glycol ether can be determined on the basis of the surface tension of the application liquid and is, to the total weight of the application liquid, preferably 5% or more and 30% or less. When the added amount is 5% or more, the surface tension reducing effect is reduced and wettability of the application liquid to the substrate is improved, whereas when the added amount is 30% or less, dispersion stability of the application liquid and application uniformity thereof by inkjet printing are improved.

Examples of the glycol ether include ethylene glycol alkyl ether, diethylene glycol alkyl ether, triethylene glycol alkyl ether, propylene glycol alkyl ether, dipropylene glycol alkyl ether and tripropylene glycol alkyl ether. In terms of viscosity, surface tension and dispersion stability of the application liquid, ethylene glycol monoalkyl ether and propylene glycol monoalkyl ether are preferable.

Examples of the ethylene glycol monoalkyl ether and the propylene glycol monoalkyl ether include ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether and propylene glycol monobutyl ether. In particular, ethylene glycol monobutyl ether and propylene glycol monopropyl ether are preferable.

It is preferable to contain a polar solvent as the high boiling point solvent. The application liquid containing a polar solvent can keep itself stable without reducing dispersion stability of the dissociable group-containing self-dispersing polymer therein, and hence can be stably discharged when applied by the inkjet method.

The polar solvent usable has a dielectric constant of 25 or more, preferably 30 or more and far preferably 40 or more. Examples thereof include ethylene glycol, diethylene glycol, triethylene glycol, propylene glycol, dipropylene glycol, butanediol, pentanediol, glycerin, dimethylformamide, dimethylacetamide, N-methylpyrrolidone and dimethyl sulfoxide. In particular, propylene glycol and ethylene glycol are preferable in terms of a drying/removal property with infrared rays, stability of the application liquid, a discharge property thereof by inkjet printing, conductivity thereof and so forth.

The added amount of the polar solvent can be determined in terms of stability of the application liquid and is, to the total weight of the application liquid, preferably 5% or more and 40% or less. When the added amount is 5% or more, the stabilization effect of the application liquid is improved, whereas when the added amount is 40% or less, surface tension of the application liquid is not too high and wettability thereof to the substrate is improved.

The dielectric constant of the solvent is measurable, for example, with a liquid dielectric constant meter Model 871 (manufactured by Nihon Rufuto Co., Ltd.).

[Applying Step]

Next, the application liquid prepared as described above is applied onto the thin metal wires-formed surface of the substrate. Thus, a coating containing a conductive material is formed thereon.

For forming the coating, in addition to the above printing methods such as gravure printing, flexographic printing and screen printing, applying methods such as roller coating, bar coating, dip coating, spin coating, casting, die coating, blade coating, bar coating, gravure coating, curtain coating, spray coating, doctor coating and the inkjet method can be used. In particular, in the case where the application liquid is disposed on the thin metal wires, by applying the application liquid by the inkjet method and drying the application liquid by infrared ray irradiation, stable thickness distribution of the application liquid, high surface smoothness and high patterning accuracy can be obtained.

[Drying Step]

The formed coating is irradiated with infrared rays and thereby dried. The solvent contained in the coating is removed by drying, and accordingly the transparent conductive layer 15 is formed on the substrate 11. Although the infrared ray irradiation method is not particularly limited, use of the below-described infrared ray (IR) drying unit is preferable. The drying is carried out in a drying tank where the water concentration is 100 ppm or less. The water concentration of the drying tank is defined by the water concentration at the end of drying in the tank, which carries out the drying.

In the step of irradiating the coating with infrared rays, the irradiation is carried out with infrared rays having a ratio of the spectral radiance at a wavelength of 5.8 μm to the spectral radiance at a wavelength of 3.0 μm of 5% or less. In the infrared rays used for drying the coating, the ratio of the spectral radiance at a wavelength of 5.8 μm to the spectral radiance at a wavelength of 3.0 μm is 5% or less, preferably 3% or less, far preferably 1% or less and most preferably 0.5% or less.

The aqueous solvent preferably used for the application liquid for forming the transparent conductive layer 15 has a strong absorption wavelength owing to OH stretching vibration at around 3.0 μm. On the other hand, the polyester resin film or the like preferably used for the substrate has almost no absorption wavelength at around 3.0 μm of the infrared wavelength region, but has a strong absorption wavelength at 5.8 μm or more of the infrared wavelength region. Hence, irradiating the coating with the infrared rays having a ratio of the spectral radiance at a wavelength of 5.8 μm to the spectral radiance at a wavelength of 3.0 μm of 5% or less can effectively dry the coating and also can prevent damage to the substrate.

Further, drying in the drying tank where the water concentration is 100 ppm or less can reduce the amount of the remaining water and high boiling point solvent in the transparent conductive layer 15. Reducing the remaining solvent(s) in the transparent conductive layer makes the microscopic structure or morphology of the transparent conductive layer composed of the conductive polymer and the non-conductive polymer excellent, and can make the transparent electrode 10 have a lower resistance and can improve stability of the transparent electrode 10.

Further, drying, by the above drying, the transparent electrode 10 such that the amount of the water molecules is 2 mg/m$^2$ or less and the amount of the high boiling point solvent is 0.05 mg/m$^2$ or less, the amounts being measured by thermal desorption spectroscopy when the transparent electrode 10 is heated to 180° C., can make the transparent electrode have a lower resistance and can improve stability of the transparent electrode.

Hence, when the above transparent electrode is applied to an electronic device, the effects due to the improved morphology of the conductive metal layer of the transparent electrode can be obtained. For example, if the above transparent electrode is applied to a transparent electrode of an organic EL element, effects such as reduction in driving voltage, reduction in emission unevenness and increase in lifetime can be obtained. Further, if the above transparent electrode is applied to a transparent electrode of a touch-screen, effects such as reduction in resistance and improvement of optical transparency can be obtained.

<<Transparent Electrode Manufacturing Apparatus>>

Next, a transparent electrode manufacturing apparatus to which the above method for manufacturing a transparent electrode(s) is applicable is described. The transparent electrode manufacturing apparatus has at least a drying tank for drying coatings to carry out the step of drying the coating containing the conductive material and the solvent.

The drying tank is provided with an IR drying unit for irradiating coatings with infrared rays. The drying tank is configured to keep the water concentration at the end of drying the coating at 100 ppm or less.

To devices of the transparent electrode manufacturing apparatus, the devices being used for the steps for manufacturing a transparent electrode(s) other than the step of drying the coating, publicly-known configurations are applicable. Further, the step of drying the coating can be carried out with the IR drying unit described in Japanese Patent Application Publication No. 2014-175560.

<<Electronic Device>>

The above transparent electrode is applicable to a variety of electronic devices. For example, the transparent electrode is applicable to a transparent electrode of various optoelectronic devices such as a liquid crystal display element, an organic luminescent element, an inorganic electroluminescent element, electronic paper, an organic solar cell and an inorganic solar cell, and electronic devices such as an electromagnetic shield and a touchscreen. In particular, it can be preferably used as a transparent electrode of an organic electroluminescent element (organic EL element). The organic EL element can be used for a self-emitting display, a back light for a liquid crystal device, a light and so forth. The organic EL element is preferably used as an electronic device for illumination because it can uniformly emit light with no unevenness. Hereinafter, as an example of the electronic device to which the above transparent electrode is applied, the structure of an organic EL element having the transparent electrode is described.

(Organic Electroluminescent Element)

An organic EL element includes at least a first electrode, an organic functional layer(s) and a second electrode arranged in this order. For example, in an organic EL element, the transparent electrode is preferably used as the anode. For the organic functional layer, the second electrode (cathode) and so forth, publicly-known materials, structures and so forth generally used in an organic EL element can be used.

There are various examples of the structure of the organic EL element, including anode/organic luminescent layer/cathode, anode/hole transport layer/organic luminescent layer/electron transport layer/cathode, anode/hole injection layer/hole transport layer/organic luminescent layer/electron transport layer/cathode, anode/hole injection layer/organic luminescent layer/electron transport layer/electron injection layer/cathode, and anode/hole injection layer/organic luminescent layer/electron injection layer/cathode.

Figure 8:
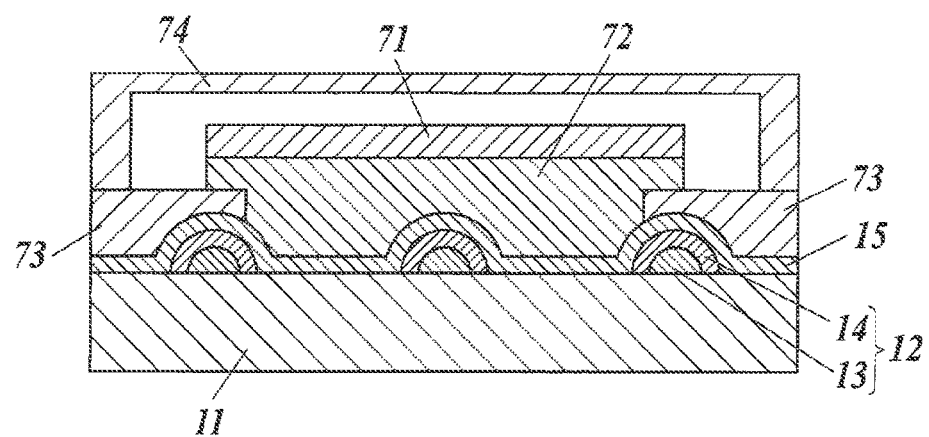
FIG. 8 is a schematic structure diagram of an organic electroluminescent element of the present invention.

FIG. 8 shows an example of the structure of an organic EL element having the transparent electrode. As shown in FIG. 8, an organic EL element 70 has a transparent electrode 10 which includes a substrate 11, a conductive metal layer 12 (thin metal wires 13 and a plating layer(s) 14) and a transparent conductive layer 15. On the side edge parts of the substrate of the transparent electrode, extraction electrodes 73 are formed.

The extraction electrodes 73 are electrically connected to the conductive metal layer 12 and the transparent conductive layer 15. On the transparent conductive layer 15 of the transparent electrode 10, an organic functional layer 72 is formed.

The organic functional layer 72 has a positive hole transport layer, a luminescent layer, a positive hole block layer, an electron transport layer and so forth. On the organic functional layer, a counter electrode 71 is formed. The counter electrode is an electrode facing the transparent electrode and having a polarity opposite to that of the transparent electrode.

The organic EL element is sealed with a sealing member 74 with parts of the extraction electrodes exposed, so that the transparent electrode and the organic functional layer are covered with and protected by the sealing member 74.

Examples of a luminescent material and a dopant material used for the organic luminescent layer 72 include but are not limited to anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate) aluminum complex, tris(4-methyl-8-quinolinate) aluminum complex, tris(5-phenyl-8-quinolinate) aluminum complex, aminoquinoline metal complex, benzoquinoline metal complex, tri-(p-terphenyl-4-yl)amine, 1-aryl-2,5-di(2-thienyl)pyrrole derivative, pyran, quinacridone, rubrene, distylbenzene derivative, distylarylene derivative, and various fluorescent dyes, rare earth metal complexes and phosphorescent materials. It is preferable to contain, of these compounds, 90 to 99.5 parts by mass of a luminescent material and 0.5 to 10 parts by mass of a dopant material.

The organic luminescent layer is formed of any of the above materials and so forth by a publicly-known method, and examples thereof include vapor deposition, application and transfer. The thickness of the organic luminescent layer is preferably 0.5 to 500 nm and particularly preferably 0.5 to 200 nm.

EXAMPLES

Hereinafter, the present invention is more specifically described with Examples. However, the present invention is not limited thereto. Note that "parts" and "%" used in Examples stand for "parts by mass" and "percent by mass (mass %)", respectively, unless otherwise specified.

First Example

<<Manufacture of Transparent Electrode 101>>
<Formation of Thin Metal Wires>

A transparent PET substrate (150 mm×150 mm) was prepared (hereinafter called "transparent substrate"). A nano-paste containing silver nanoparticles for inkjet (NPS-JL manufactured by Harima Chemicals Group, Inc.; hereinafter may be called "Ag nanoparticle ink") was applied onto an area of 100 mm×100 mm of the transparent substrate by an inkjet apparatus in a lattice pattern having a line width of 50 μm and a pitch of 1 mm. Thus, thin metal wires of the thin metal wire pattern were formed. The thin metal wires were inclined at 45° to the substrate (see FIG. 2E). At the time, in order to obtain a sufficient height, the application was carried out three times such that the nano-paste was piled.

As the inkjet apparatus, a desktop-type robot Shotmaster-300 (manufactured by Musashi Engineering, Inc.) provided with an inkjet head(s) KM512SHX manufactured by Konica Minolta, Inc. was used, and controlled by an inkjet evaluation system EB150 (manufactured by Konica Minolta, Inc.).

Next, to the substrate, on which the thin metal wires had been formed, xenon light was emitted for calcination with PulseForge 1300 manufactured by NovaCentrix.

Xenon light took pulse emission of 250 μs on a cycle of 500 μs, and was adjusted to apply an energy of 1500 mJ/cm$^2$ and emitted.

The thin metal wire pattern was measured with a high-luminance noncontact three-dimensional surface roughness meter Wyko NT9100 (manufactured by Nihon Veeco K.K.). The width of the pattern was 70 μm, and the total average height thereof was 1 μm.

<Formation of Transparent Conductive Layer>

A transparent conductive polymer PEDOT/PSS (Clevios PH1000, manufactured by Heraeus, 1.2% liquid) and polyhydroxyacrylate (PHEA) (20% liquid) were mixed at a solid content ratio of 15:85, 70 parts by mass of this mixture was mixed with 15 parts by mass of propylene glycol and 12 parts by mass of ethylene glycol monobutyl ether, and then water was added thereto so that the resulting product reached 100 parts by mass. Thus, an application liquid for forming a transparent conductive layer was prepared.

PHEA was, as described below, synthesized and prepared to be a 20 mass % aqueous dispersion.

In a 300 mL recovery flask, 5.0 g (43.1 mmol, Fw 116.12) of 2-hydroxyethyl acrylate (manufactured by Tokyo Chemical Industry Co., Ltd.) and 0.7 g (4.3 mmol, Fw 164.21) of 2,2'-azobis(2-methylisopropylonitrile) were poured, 100 mL of tetrahydrofuran (THF) was added thereto, and the resulting product was heated to reflux for eight hours.

Thereafter, the solution was cooled to room temperature and dropped into 2.0 L of methyl-ethyl-ketone which had been stirred hard. After the reaction solution was stirred for one hour, methyl-ethyl-ketone was decanted, and the polymer(s) which had adhered to the wall was cleaned with 100 mL of methyl-ethyl-ketone three times.

A transparent conductive polymer was dissolved in 100 mL of THF, the resulting product was moved to a 200 mL flask, and THF was subjected to vacuum distillation with a rotary evaporator. Thereafter, depressurization was carried out at 80° C. for three hours, so that the remaining THF was distillated, and 4.1 g (yield of 82%) of PHEA having a number average molecular weight of 57,800 and a molecular weight distribution of 1.24 was produced.

Next, the application liquid prepared for forming a transparent conductive layer was applied by inkjet printing onto an area of 102 mm×102 mm of the substrate, on which the thin metal wires had been formed. The thickness of the transparent conductive layer was 150 nm.

Next, the substrate, onto which the transparent conductive layer had been applied, was moved to a nitrogen-filled glovebox which had been adjusted to be a dew point of −80°

C. or less and an oxygen concentration of 1 ppm or less, and was dried with an infrared ray heater under the conditions of a filament temperature of 1,500° C. and a treatment time of ten minutes. Thus, a transparent electrode 101 was obtained.

The infrared ray heater was one constituted of a heater (1,000 W, color temperature of 2,500 K) manufactured by USHIO Inc. provided with an air-cooling mechanism in a quartz glass duplex tube with reference to Japanese Patent No. 4790092. Distance between the heater and the sample(s) was 100 mm.

<<Manufacture of Transparent Electrode 102>>
<Formation of Thin Metal Wires>

A silver nanoparticle ink (NPS manufactured by Harima Chemicals Group, Inc.) was applied onto an area of 100 mm×100 mm of the transparent substrate by a screen printing apparatus in a lattice pattern having a line width of 50 μm and a pitch of 1 mm. Thus, thin metal wires of the thin metal wire pattern were formed. The thin metal wires were inclined at 45° to the substrate.

Next, to the substrate, on which the thin metal wires had been formed, xenon light was emitted for calcination with PulseForge 1300 manufactured by NovaCentrix. The emission conditions of xenon light were the same as those in manufacture of the transparent electrode 101.

The thin metal wire pattern was measured with a high-luminance noncontact three-dimensional surface roughness meter Wyko NT9100 (manufactured by Nihon Veeco K.K.). The width of the pattern was 70 μm, and the average height thereof was 1.0 μm.

<Formation of Transparent Conductive Layer>

A transparent conductive layer was formed in the same manner as that of the transparent electrode 101. Thus, a transparent electrode 102 was obtained.

<<Manufacture of Transparent Electrode 103>>
<Formation of Thin Metal Wires>

Thin metal wires were formed in the same manner as those of the transparent electrode 101.

<Formation of Transparent Conductive Layer>

The substrate, on which the thin metal wires had been formed, was set in a commercially-available DC magnetron sputtering device.

Once a vacuum chamber was vacuumed to $1\times10^{-3}$ Pa or less, argon gas and water vapor were introduced thereto to be a pressure of 3 Pa. At the time, the ratio of argon gas to water vapor was 100:1. Film forming was carried out at an output of 300 W. Thus, an ITO layer of 150 nm was formed, and accordingly a transparent electrode 103 was obtained.

<<Manufacture of Transparent Electrode 104>>
<Formation of Thin Metal Wires>

Thin metal wires were formed in the same manner as those of the transparent electrode 102.

<Formation of Transparent Conductive Layer>

A transparent conductive layer was formed in the same manner as that of the transparent electrode 103.

<<Manufacture of Transparent Electrode 105>>
<Formation of Thin Metal Wires>

Thin metal wires were formed in the same manner as those of the transparent electrode 101 except that the application in printing the thin metal wires was carried out one time. The average height was 0.3 μm.

<Formation of Plating Layer>

Next, silver plating was carried out to plate the thin metal wires with silver of 0.7 μm, so that the total average height together with the thin metal wires was 1 μm. Silver plating was carried out using a plating liquid of silver cyanide, potassium cyanide and potassium carbonate by an electrolytic method using the thin metal wires as an electrode(s) for electric power supply.

<Formation of Transparent Conductive Layer>

A transparent conductive layer was formed in the same manner as that of the transparent electrode 101.

<<Manufacture of Transparent Electrode 106>>
<Formation of Thin Metal Wires>

Thin metal wires were formed in the same manner as those of the transparent electrode 102 except that the application in printing the thin metal wires was carried out one time. The average height was 0.3 μm.

<Formation of Plating Layer>

A plating layer was formed in the same manner as that of the transparent electrode 105.

<Formation of Transparent Conductive Layer>

A transparent conductive layer was formed in the same manner as that of the transparent electrode 101.

<<Manufacture of Transparent Electrode 107>>
<Formation of Thin Metal Wires>

A silver nanoparticle ink (NPS manufactured by Harima Chemicals Group, Inc.) was applied by a letterpress reverse printing apparatus in a lattice pattern having a line width of 50 μm and a pitch of 1 mm. Thus, thin metal wires of the thin metal wire pattern were formed. The thin metal wires were inclined at 45° to the substrate. The height was measured and it was 0.3 μm.

The letterpress reverse printing is a method of applying a silver nanoparticle ink onto a blanket, thereby forming a silver nanoparticle ink-applied surface, and transferring the same to a substrate.

As the blanket, it is preferable to use a silicone blanket composed of silicone.

First, a silver nanoparticle ink is applied onto the blanket. Next, a letterpress plate provided with a plate corresponding to a predetermined pattern shape as needed is pressed, so that silver nanoparticles contained in the silver nanoparticle ink contacting the letterpress plate are transferred from the blanket to the surface of the letterpress plate.

Next, the blanket and the substrate are brought into contact with one another, so that the remaining silver nanoparticles on the blanket are transferred to the surface of the substrate. This method can form thin metal wires having a predetermined pattern.

<Formation of Plating Layer>

A plating layer was formed in the same manner as that of the transparent electrode 105.

<Formation of Transparent Conductive Layer>

A transparent conductive layer was formed in the same manner as that of the transparent electrode 101.

<<Manufacture of Transparent Electrode 108>>
<Formation of Thin Metal Wires>

Thin metal wires were formed in the same manner as those of the transparent electrode 105.

<Formation of Plating Layer>

A plating layer was formed in the same manner as that of the transparent electrode 105.

<Formation of Transparent Conductive Layer>

A transparent conductive layer was formed in the same manner as that of the transparent electrode 103.

<<Manufacture of Transparent Electrode 109>>
<Formation of Thin Metal Wires>

Thin metal wires were formed in the same manner as those of the transparent electrode 106.

<Formation of Plating Layer>

A plating layer was formed in the same manner as that of the transparent electrode 105.

<Formation of Transparent Conductive Layer>
A transparent conductive layer was formed in the same manner as that of the transparent electrode 103.

<<Manufacture of Transparent Electrode 110>>
<Formation of Thin Metal Wires>
Thin metal wires were formed in the same manner as those of the transparent electrode 107.
<Formation of Plating Layer>
A plating layer was formed in the same manner as that of the transparent electrode 105.
<Formation of Transparent Conductive Layer>
A transparent conductive layer was formed in the same manner as that of the transparent electrode 103.

<<Manufacture of Transparent Electrode 111>>
<Formation of Thin Metal Wires>
Thin metal wires were formed in the same manner as those of the transparent electrode 105.
<Formation of Plating Layer>
Next, copper plating was carried out to plate the thin metal wires with copper of 0.7 µm, so that the total average height together with the thin metal wires was 1 µm. Copper plating was carried out using a plating liquid of copper sulfate and sulfuric acid by an electrolytic method using the thin metal wires as an electrode(s) for electric power supply.
<Formation of Transparent Conductive Layer>
A transparent conductive layer was formed in the same manner as that of the transparent electrode 101.

<<Manufacture of Transparent Electrode 112>>
<Formation of Thin Metal Wires>
Thin metal wires were formed in the same manner as those of the transparent electrode 106.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 113>>
<Formation of Thin Metal Wires>
Thin metal wires were formed in the same manner as those of the transparent electrode 107.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 114>>
<Formation of Thin Metal Wires>
Thin metal wires were formed in the same manner as those of the transparent electrode 105.
<Formation of Plating Layer>
A plating layer was formed in the same manner as that of the transparent electrode 111.
<Formation of Transparent Conductive Layer>
A transparent conductive layer was formed in the same manner as that of the transparent electrode 103.

<<Manufacture of Transparent Electrode 115>>
<Formation of Thin Metal Wires>
Thin metal wires were formed in the same manner as those of the transparent electrode 106.
<Formation of Plating Layer>
A plating layer was formed in the same manner as that of the transparent electrode 111.
<Formation of Transparent Conductive Layer>
A transparent conductive layer was formed in the same manner as that of the transparent electrode 103.

<<Manufacture of Transparent Electrode 116>>
<Formation of Thin Metal Wires>
Thin metal wires were formed in the same manner as those of the transparent electrode 107.
<Formation of Plating Layer>
A plating layer was formed in the same manner as that of the transparent electrode 111.
<Formation of Transparent Conductive Layer>
A transparent conductive layer was formed in the same manner as that of the transparent electrode 103.

<<Manufacture of Transparent Electrode 117>>
<Formation of Thin Metal Wires>
Thin metal wires were formed in the same manner as those of the transparent electrode 105.
<Formation of Plating Layer>
An activator (Ace Clean A220 manufactured by Okuno Chemical Industries Co., Ltd.) was applied onto the thin metal wires to activate plating nuclei.
Next, an electroless copper plating agent (OPC-750 electroless copper M manufactured by Okuno Chemical Industries Co., Ltd.) was applied onto the activated surface, and electroless copper plating was carried out under the conditions of 20° C. and 20 minutes.
<Formation of Transparent Conductive Layer>
A transparent conductive layer was formed in the same manner as that of the transparent electrode 101.

<<Manufacture of Transparent Electrode 118>>
<Formation of Thin Metal Wires>
Thin metal wires were formed in the same manner as those of the transparent electrode 105.
<Formation of Plating Layer>
A plating layer was formed in the same manner as that of the transparent electrode 117.
<Formation of Transparent Conductive Layer>
A transparent conductive layer was formed in the same manner as that of the transparent electrode 103.

<<Manufacture of Transparent Electrode 119>>
<Formation of Thin Metal Wires>
Thin metal wires were formed in the same manner as those of the transparent electrode 105.
<Formation of Plating Layer>
Next, copper plating was carried out to plate the thin metal wires with copper of 0.6 µm, and then nickel plating was carried out to plate the copper-plated thin metal wires with nickel of 0.1 µm, so that the total average height together with the thin metal wires was 1 µm. For copper plating, a plating liquid of copper sulfate and sulfuric acid was used, and for nickel plating, a plating liquid of nickel chloride and hydrochloric acid was used. Both of copper plating and nickel plating were carried out by an electrolytic method using the thin metal wires as an electrode(s) for electric power supply.
<Formation of Transparent Conductive Layer>
A transparent conductive layer was formed in the same manner as that of the transparent electrode 101.

<<Manufacture of Transparent Electrode 120>>
<Formation of Thin Metal Wires>
Thin metal wires were formed in the same manner as those of the transparent electrode 106.
<Formation of Plating Layer>
A plating layer was formed in the same manner as that of the transparent electrode 119.
<Formation of Transparent Conductive Layer>
A transparent conductive layer was formed in the same manner as that of the transparent electrode 101.

<<Manufacture of Transparent Electrode 121>>
<Formation of Thin Metal Wires>
Thin metal wires were formed in the same manner as those of the transparent electrode 107.
<Formation of Plating Layer>
A plating layer was formed in the same manner as that of the transparent electrode 119.
<Formation of Transparent Conductive Layer>
A transparent conductive layer was formed in the same manner as that of the transparent electrode 101.

<<Manufacture of Transparent Electrode 122>>
<Formation of Thin Metal Wires>
Thin metal wires were formed in the same manner as those of the transparent electrode 105.
<Formation of Plating Layer>
A plating layer was formed in the same manner as that of the transparent electrode 119.
<Formation of Transparent Conductive Layer>
A transparent conductive layer was formed in the same manner as that of the transparent electrode 103.

<<Manufacture of Transparent Electrode 123>>
<Formation of Thin Metal Wires>
Thin metal wires were formed in the same manner as those of the transparent electrode 106.
<Formation of Plating Layer>
A plating layer was formed in the same manner as that of the transparent electrode 119.
<Formation of Transparent Conductive Layer>
A transparent conductive layer was formed in the same manner as that of the transparent electrode 103.

<<Manufacture of Transparent Electrode 124>>
<Formation of Thin Metal Wires>
Thin metal wires were formed in the same manner as those of the transparent electrode 107.
<Formation of Plating Layer>
A plating layer was formed in the same manner as that of the transparent electrode 119.
<Formation of Transparent Conductive Layer>
A transparent conductive layer was formed in the same manner as that of the transparent electrode 103.

<<Manufacture of Transparent Electrode 125>>
<Formation of Thin Metal Wires>
A nano-paste containing copper nanoparticles (hereinafter may be called "copper nanoparticle ink") was prepared with reference to Japanese Patent Application Publication No. 2012-178334.
Note that a copper nanoparticle ink for inkjet was prepared to have a viscosity of about 10 mPa·sec., whereas a copper nanoparticle ink for screen printing and a copper nanoparticle ink for letterpress reverse printing were prepared to have a viscosity of about 100 Pa·sec., by adjusting concentrations of resin and copper nanoparticles.
Thin metal wires were formed in the same manner as those of the transparent electrode 105 except that a nano-paste containing copper nanoparticles was used.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 126>>
<Formation of Thin Metal Wires>
Thin metal wires were formed in the same manner as those of the transparent electrode 106 except that a nano-paste containing copper nanoparticles was used as with the transparent electrode 125.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 127>>
<Formation of Thin Metal Wires>
Thin metal wires were formed in the same manner as those of the transparent electrode 107 except that a nano-paste containing copper nanoparticles was used as with the transparent electrode 125.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 128>>
<Formation of Thin Metal Wires>
Thin metal wires were formed in the same manner as those of the transparent electrode 125.
<Formation of Plating Layer>
A plating layer was formed in the same manner as that of the transparent electrode 111.
<Formation of Transparent Conductive Layer>
A transparent conductive layer was formed in the same manner as that of the transparent electrode 103.

<<Manufacture of Transparent Electrode 129>>
<Formation of Thin Metal Wires>
Thin metal wires were formed in the same manner as those of the transparent electrode 126.
<Formation of Plating Layer>
A plating layer was formed in the same manner as that of the transparent electrode 111.
<Formation of Transparent Conductive Layer>
A transparent conductive layer was formed in the same manner as that of the transparent electrode 103.

<<Manufacture of Transparent Electrode 130>>
<Formation of Thin Metal Wires>
Thin metal wires were formed in the same manner as those of the transparent electrode 127.
<Formation of Plating Layer>
A plating layer was formed in the same manner as that of the transparent electrode 111.
<Formation of Transparent Conductive Layer>
A transparent conductive layer was formed in the same manner as that of the transparent electrode 103

<<Manufacture of Transparent Electrode 131>>
<Formation of Thin Metal Wires>
Thin metal wires were formed in the same manner as those of the transparent electrode 105 except that a silver complex ink for inkjet (TEC-IJ-010) manufactured by InkTec Co., Ltd. was used instead of the silver nanoparticle ink.
<Formation of Plating Layer>
A plating layer was formed in the same manner as that of the transparent electrode 111.
<Formation of Transparent Conductive Layer>
A transparent conductive layer was formed in the same manner as that of the transparent electrode 101.

<<Manufacture of Transparent Electrode 132>>
<Formation of Thin Metal Wires>
Thin metal wires were formed in the same manner as those of the transparent electrode 106 except that a silver complex paste ink (TEC-PA-010) manufactured by InkTec Co., Ltd. was used instead of the silver nanoparticle ink.

<Formation of Plating Layer>

A plating layer was formed in the same manner as that of the transparent electrode 111.

<Formation of Transparent Conductive Layer>

A transparent conductive layer was formed in the same manner as that of the transparent electrode 101.

<<Manufacture of Transparent Electrode 133>>

<Formation of Thin Metal Wires>

Thin metal wires were formed in the same manner as those of the transparent electrode 107 except that a silver complex paste ink (TEC-PA-010) manufactured by InkTec Co., Ltd. was used instead of the silver nanoparticle ink.

<Formation of Plating Layer>

A plating layer was formed in the same manner as that of the transparent electrode 111.

<Formation of Transparent Conductive Layer>

A transparent conductive layer was formed in the same manner as that of the transparent electrode 101.

<<Manufacture of Transparent Electrode 134>>

<Formation of Thin Metal Wires>

Thin metal wires were formed in the same manner as those of the transparent electrode 131.

<Formation of Plating Layer>

A plating layer was formed in the same manner as that of the transparent electrode 111.

<Formation of Transparent Conductive Layer>

A transparent conductive layer was formed in the same manner as that of the transparent electrode 103

<<Manufacture of Transparent Electrode 135>>

<Formation of Thin Metal Wires>

Thin metal wires were formed in the same manner as those of the transparent electrode 132.

<Formation of Plating Layer>

A plating layer was formed in the same manner as that of the transparent electrode 111.

<Formation of Transparent Conductive Layer>

A transparent conductive layer was formed in the same manner as that of the transparent electrode 103

<<Manufacture of Transparent Electrode 136>>

<Formation of Thin Metal Wires>

Thin metal wires were formed in the same manner as those of the transparent electrode 133.

<Formation of Plating Layer>

A plating layer was formed in the same manner as that of the transparent electrode 111.

<Formation of Transparent Conductive Layer>

A transparent conductive layer was formed in the same manner as that of the transparent electrode 103

<<Manufacture of Transparent Electrode 137>>

<Formation of Thin Metal Wires>

Thin metal wires were formed by printing using the inkjet parallel line drawing method (hereinafter may be called "parallel line drawing method") with an inkjet head(s) (KM512L manufactured by Konica Minolta, Inc., a standard droplet amount of 42 pl) under the following conditions with the substrate temperature being kept at 50° C.

| Printing Conditions: | |
| --- | --- |
| Pitch in Nozzle Line Direction | 141 μm |
| Dot-to-Dot Pitch in Scanning Direction | 60 μm |
| Ink: | |
| Concentration of Silver Nanoparticles | 1 mass % |
| Concentration of Silicon Activator | 0.25 mass % |
| 1,3-Butandiol | 8 mass % |
| Deionized Water | 90.75 mass % |

The height, width and pitch were measured, and they were 0.06 μm, 5.8 μm and 0.07 μm, respectively.

The shape of the thin metal wires was latticed, and the pattern was one inclining at 45° from the substrate.

<Formation of Plating Layer>

Next, silver plating was carried out to plate the thin metal wires with silver of 0.44 μm, so that the total average height together with the thin metal wires was 0.5 μm.

<Formation of Transparent Conductive Layer>

A transparent conductive layer was formed in the same manner as that of the transparent electrode 101.

<<Manufacture of Transparent Electrode 138>>

<Formation of Thin Metal Wires>

Thin metal wires were formed in the same manner as those of the transparent electrode 137.

<Formation of Plating Layer>

A plating layer was formed in the same manner as that of the transparent electrode 137.

<Formation of Transparent Conductive Layer>

A transparent conductive layer was formed in the same manner as that of the transparent electrode 103

<<Manufacture of Transparent Electrode 139>>

<Formation of Thin Metal Wires>

Thin metal wires were formed in the same manner as those of the transparent electrode 137.

<Formation of Plating Layer>

Next, copper plating was carried out to plate the thin metal wires with copper of 0.44 μm, so that the total average height together with the height of the thin metal wires was 0.5 μm.

<Formation of Transparent Conductive Layer>

A transparent conductive layer was formed in the same manner as that of the transparent electrode 101.

<<Manufacture of Transparent Electrode 140>>

<Formation of Thin Metal Wires>

Thin metal wires were formed in the same manner as those of the transparent electrode 137.

<Formation of Plating Layer>

A plating layer was formed in the same manner as that of the transparent electrode 139.

<Formation of Transparent Conductive Layer>

A transparent conductive layer was formed in the same manner as that of the transparent electrode 103

<<Manufacture of Transparent Electrodes 141 to 146>>

A transparent electrode 141 was manufactured in the same manner as the transparent electrode 105 except that alkali-free glass EG-EX manufactured by Corning Incorporated was used as its substrate instead of the PET substrate.

Transparent electrodes 142, 143, 144, 145 and 146 were manufactured in the same manner as the transparent electrodes 106, 107, 108, 109 and 110, respectively.

Structures of the manufactured transparent electrodes are shown in TABLE 1-1 and TABLE 1-2. In the tables, "IJ" represents inkjet. Structural formulae of compounds used in Examples are shown below.

TABLE 1-1

| TRANSPARENT ELECTRODE NO. | TRANSPARENT SUPPORT | CONDUCTIVE METAL LAYER ||||||
|---|---|---|---|---|---|---|---|
| | | THIN METAL WIRE |||||  |
| | | MATERIAL | PRINTING METHOD | HEIGHT [μm] | WIRE WIDTH [μm] | PITCH [mm] | PLATING LAYER METHOD |
| 101 | PET | Ag NANOPARTICLE | IJ | 1.00 | 50 | 1 | — |
| 102 | PET | Ag NANOPARTICLE | SCREEN | 1.00 | 50 | 1 | — |
| 103 | PET | Ag NANOPARTICLE | IJ | 1.00 | 50 | 1 | — |
| 104 | PET | Ag NANOPARTICLE | SCREEN | 1.00 | 50 | 1 | — |
| 105 | PET | Ag NANOPARTICLE | IJ | 0.30 | 50 | 1 | ELECTROLYTIC |
| 106 | PET | Ag NANOPARTICLE | SCREEN | 0.30 | 50 | 1 | ELECTROLYTIC |
| 107 | PET | Ag NANOPARTICLE | LETTERPRESS REVERSE | 0.30 | 50 | 1 | ELECTROLYTIC |
| 108 | PET | Ag NANOPARTICLE | IJ | 0.30 | 50 | 1 | ELECTROLYTIC |
| 109 | PET | Ag NANOPARTICLE | SCREEN | 0.30 | 50 | 1 | ELECTROLYTIC |
| 110 | PET | Ag NANOPARTICLE | LETTERPRESS REVERSE | 0.30 | 50 | 1 | ELECTROLYTIC |
| 111 | PET | Ag NANOPARTICLE | IJ | 0.30 | 50 | 1 | ELECTROLYTIC |
| 112 | PET | Ag NANOPARTICLE | SCREEN | 0.30 | 50 | 1 | ELECTROLYTIC |
| 113 | PET | Ag NANOPARTICLE | LETTERPRESS REVERSE | 0.30 | 50 | 1 | ELECTROLYTIC |
| 114 | PET | Ag NANOPARTICLE | IJ | 0.30 | 50 | 1 | ELECTROLYTIC |
| 115 | PET | Ag NANOPARTICLE | SCREEN | 0.30 | 50 | 1 | ELECTROLYTIC |
| 116 | PET | Ag NANOPARTICLE | LETTERPRESS REVERSE | 0.30 | 50 | 1 | ELECTROLYTIC |
| 117 | PET | Ag NANOPARTICLE | IJ | 0.30 | 50 | 1 | ELECTROLESS |
| 118 | PET | Ag NANOPARTICLE | IJ | 0.30 | 50 | 1 | ELECTROLESS |
| 119 | PET | Ag NANOPARTICLE | IJ | 0.30 | 50 | 1 | ELECTROLYTIC |
| 120 | PET | Ag NANOPARTICLE | SCREEN | 0.30 | 50 | 1 | ELECTROLYTIC |
| 121 | PET | Ag NANOPARTICLE | LETTERPRESS REVERSE | 0.30 | 50 | 1 | ELECTROLYTIC |
| 122 | PET | Ag NANOPARTICLE | IJ | 0.30 | 50 | 1 | ELECTROLYTIC |
| 123 | PET | Ag NANOPARTICLE | SCREEN | 0.30 | 50 | 1 | ELECTROLYTIC |
| 124 | PET | Ag NANOPARTICLE | LETTERPRESS REVERSE | 0.30 | 50 | 1 | ELECTROLYTIC |

| TRANSPARENT ELECTRODE NO. | CONDUCTIVE METAL LAYER ||| TRANSPARENT CONDUCTIVE LAYER || REMARK |
|---|---|---|---|---|---|---|
| | PLATING LAYER || TOTAL AVERAGE HEIGHT [μm] | | FILM FORMING METHOD | |
| | METAL | HEIGHT [μm] | | MATERIAL | | |
| 101 | — | — | 1.0 | PEDOT/PSS | IJ | COMPARATIVE EXAMPLE |
| 102 | — | — | 1.0 | PEDOT/PSS | IJ | COMPARATIVE EXAMPLE |
| 103 | — | — | 1.0 | ITO | SPUTTERING | COMPARATIVE EXAMPLE |
| 104 | — | — | 1.0 | ITO | SPUTTERING | COMPARATIVE EXAMPLE |
| 105 | Ag | 0.7 | 1.0 | PEDOT/PSS | IJ | PRESENT INVENTION |
| 106 | Ag | 0.7 | 1.0 | PEDOT/PSS | IJ | PRESENT INVENTION |
| 107 | Ag | 0.7 | 1.0 | PEDOT/PSS | IJ | PRESENT INVENTION |
| 108 | Ag | 0.7 | 1.0 | ITO | SPUTTERING | PRESENT INVENTION |
| 109 | Ag | 0.7 | 1.0 | ITO | SPUTTERING | PRESENT INVENTION |
| 110 | Ag | 0.7 | 1.0 | ITO | SPUTTERING | PRESENT INVENTION |
| 111 | Cu | 0.7 | 1.0 | PEDOT/PSS | IJ | PRESENT INVENTION |
| 112 | Cu | 0.7 | 1.0 | PEDOT/PSS | IJ | PRESENT INVENTION |
| 113 | Cu | 0.7 | 1.0 | PEDOT/PSS | IJ | PRESENT INVENTION |
| 114 | Cu | 0.7 | 1.0 | ITO | SPUTTERING | PRESENT INVENTION |
| 115 | Cu | 0.7 | 1.0 | ITO | SPUTTERING | PRESENT INVENTION |
| 116 | Cu | 0.7 | 1.0 | ITO | SPUTTERING | PRESENT INVENTION |
| 117 | Cu | 0.7 | 1.0 | PEDOT/PSS | IJ | PRESENT INVENTION |
| 118 | Cu | 0.7 | 1.0 | ITO | SPUTTERING | PRESENT INVENTION |
| 119 | Cu/Ni | 0.6/0.1 | 1.0 | PEDOT/PSS | IJ | PRESENT INVENTION |
| 120 | Cu/Ni | 0.6/0.1 | 1.0 | PEDOT/PSS | IJ | PRESENT INVENTION |
| 121 | Cu/Ni | 0.6/0.1 | 1.0 | PEDOT/PSS | IJ | PRESENT INVENTION |
| 122 | Cu/Ni | 0.6/0.1 | 1.0 | ITO | SPUTTERING | PRESENT INVENTION |
| 123 | Cu/Ni | 0.6/0.1 | 1.0 | ITO | SPUTTERING | PRESENT INVENTION |
| 124 | Cu/Ni | 0.6/0.1 | 1.0 | ITO | SPUTTERING | PRESENT INVENTION |

TABLE 1-2

| TRANSPARENT ELECTRODE NO. | TRANSPARENT SUPPORT | CONDUCTIVE METAL LAYER — THIN METAL WIRE | | | | | |
|---|---|---|---|---|---|---|---|
| | | MATERIAL | PRINTING METHOD | WIRE HEIGHT [μm] | WIDTH [μm] | PITCH [mm] | PLATING LATER METHOD |
| 125 | PET | Cu NANOPARTICLE | IJ | 0.30 | 50 | 1 | ELECTROLYTIC |
| 126 | PET | Cu NANOPARTICLE | SCREEN | 0.30 | 50 | 1 | ELECTROLYTIC |
| 127 | PET | Cu NANOPARTICLE | LETTERPRESS REVERSE | 0.30 | 50 | 1 | ELECTROLYTIC |
| 128 | PET | Cu NANOPARTICLE | IJ | 0.30 | 50 | 1 | ELECTROLYTIC |
| 129 | PET | Cu NANOPARTICLE | SCREEN | 0.30 | 50 | 1 | ELECTROLYTIC |
| 130 | PET | Cu NANOPARTICLE | LETTERPRESS REVERSE | 0.30 | 50 | 1 | ELECTROLYTIC |
| 131 | PET | Ag COMPLEX | IJ | 0.30 | 50 | 1 | ELECTROLYTIC |
| 132 | PET | Ag COMPLEX | SCREEN | 0.30 | 50 | 1 | ELECTROLYTIC |
| 133 | PET | Ag COMPLEX | LETTERPRESS REVERSE | 0.30 | 50 | 1 | ELECTROLYTIC |
| 134 | PET | Ag COMPLEX | IJ | 0.30 | 50 | 1 | ELECTROLYTIC |
| 135 | PET | Ag COMPLEX | SCREEN | 0.30 | 50 | 1 | ELECTROLYTIC |
| 136 | PET | Ag COMPLEX | LETTERPRESS REVERSE | 0.30 | 50 | 1 | ELECTROLYTIC |
| 137 | PET | Ag NANOPARTICLE | PARALLEL LINE DRAWING | 0.06 | 5.8 | 0.07 | ELECTROLYTIC |
| 138 | PET | Ag NANOPARTICLE | PARALLEL LINE DRAWING | 0.06 | 5.8 | 0.07 | ELECTROLYTIC |
| 139 | PET | Ag NANOPARTICLE | PARALLEL LINE DRAWING | 0.06 | 5.8 | 0.07 | ELECTROLYTIC |
| 140 | PET | Ag NANOPARTICLE | PARALLEL LINE DRAWING | 0.06 | 5.8 | 0.07 | ELECTROLYTIC |
| 141 | ALKALI-FREE GLASS | Ag NANOPARTICLE | IJ | 0.30 | 50 | 1 | ELECTROLYTIC |
| 142 | ALKALI-FREE GLASS | Ag NANOPARTICLE | SCREEN | 0.30 | 50 | 1 | ELECTROLYTIC |
| 143 | ALKALI-FREE GLASS | Ag NANOPARTICLE | LETTERPRESS REVERSE | 0.30 | 50 | 1 | ELECTROLYTIC |
| 144 | ALKALI-FREE GLASS | Ag NANOPARTICLE | IJ | 0.30 | 50 | 1 | ELECTROLYTIC |
| 145 | ALKALI-FREE GLASS | Ag NANOPARTICLE | SCREEN | 0.30 | 50 | 1 | ELECTROLYTIC |
| 146 | ALKALI-FREE GLASS | Ag NANOPARTICLE | LETTERPRESS REVERSE | 0.30 | 50 | 1 | ELECTROLYTIC |

| TRANSPARENT ELECTRODE NO. | CONDUCTIVE METAL LAYER PLATING LATER METAL | TOTAL AVERAGE HEIGHT [μm] | TRANSPARENT CONDUCTIVE LAYER MATERIAL | FILM FORMING METHOD | REMARK |
|---|---|---|---|---|---|
| 125 | Cu | 0.7 | 1.0 | PEDOT/PSS | IJ | PRESENT INVENTION |
| 126 | Cu | 0.7 | 1.0 | PEDOT/PSS | IJ | PRESENT INVENTION |
| 127 | Cu | 0.7 | 1.0 | PEDOT/PSS | IJ | PRESENT INVENTION |
| 128 | Cu | 0.7 | 1.0 | ITO | SPUTTERING | PRESENT INVENTION |
| 129 | Cu | 0.7 | 1.0 | ITO | SPUTTERING | PRESENT INVENTION |
| 130 | Cu | 0.7 | 1.0 | ITO | SPUTTERING | PRESENT INVENTION |
| 131 | Cu | 0.7 | 1.0 | PEDOT/PSS | IJ | PRESENT INVENTION |
| 132 | Cu | 0.7 | 1.0 | PEDOT/PSS | IJ | PRESENT INVENTION |
| 133 | Cu | 0.7 | 1.0 | PEDOT/PSS | IJ | PRESENT INVENTION |
| 134 | Cu | 0.7 | 1.0 | ITO | SPUTTERING | PRESENT INVENTION |
| 135 | Cu | 0.7 | 1.0 | ITO | SPUTTERING | PRESENT INVENTION |
| 136 | Cu | 0.7 | 1.0 | ITO | SPUTTERING | PRESENT INVENTION |
| 137 | Ag | 0.44 | 0.5 | PEDOT/PSS | IJ | PRESENT INVENTION |
| 138 | Ag | 0.44 | 0.5 | ITO | SPUTTERING | PRESENT INVENTION |
| 139 | Cu | 0.44 | 0.5 | PEDOT/PSS | IJ | PRESENT INVENTION |
| 140 | Cu | 0.44 | 0.5 | ITO | SPUTTERING | PRESENT INVENTION |
| 141 | Ag | 0.7 | 1.0 | PEDOT/PSS | IJ | PRESENT INVENTION |
| 142 | Ag | 0.7 | 1.0 | PEDOT/PSS | IJ | PRESENT INVENTION |
| 143 | Ag | 0.7 | 1.0 | PEDOT/PSS | IJ | PRESENT INVENTION |
| 144 | Ag | 0.7 | 1.0 | ITO | SPUTTERING | PRESENT INVENTION |
| 145 | Ag | 0.7 | 1.0 | ITO | SPUTTERING | PRESENT INVENTION |
| 146 | Ag | 0.7 | 1.0 | ITO | SPUTTERING | PRESENT INVENTION |

[Chem. 2]

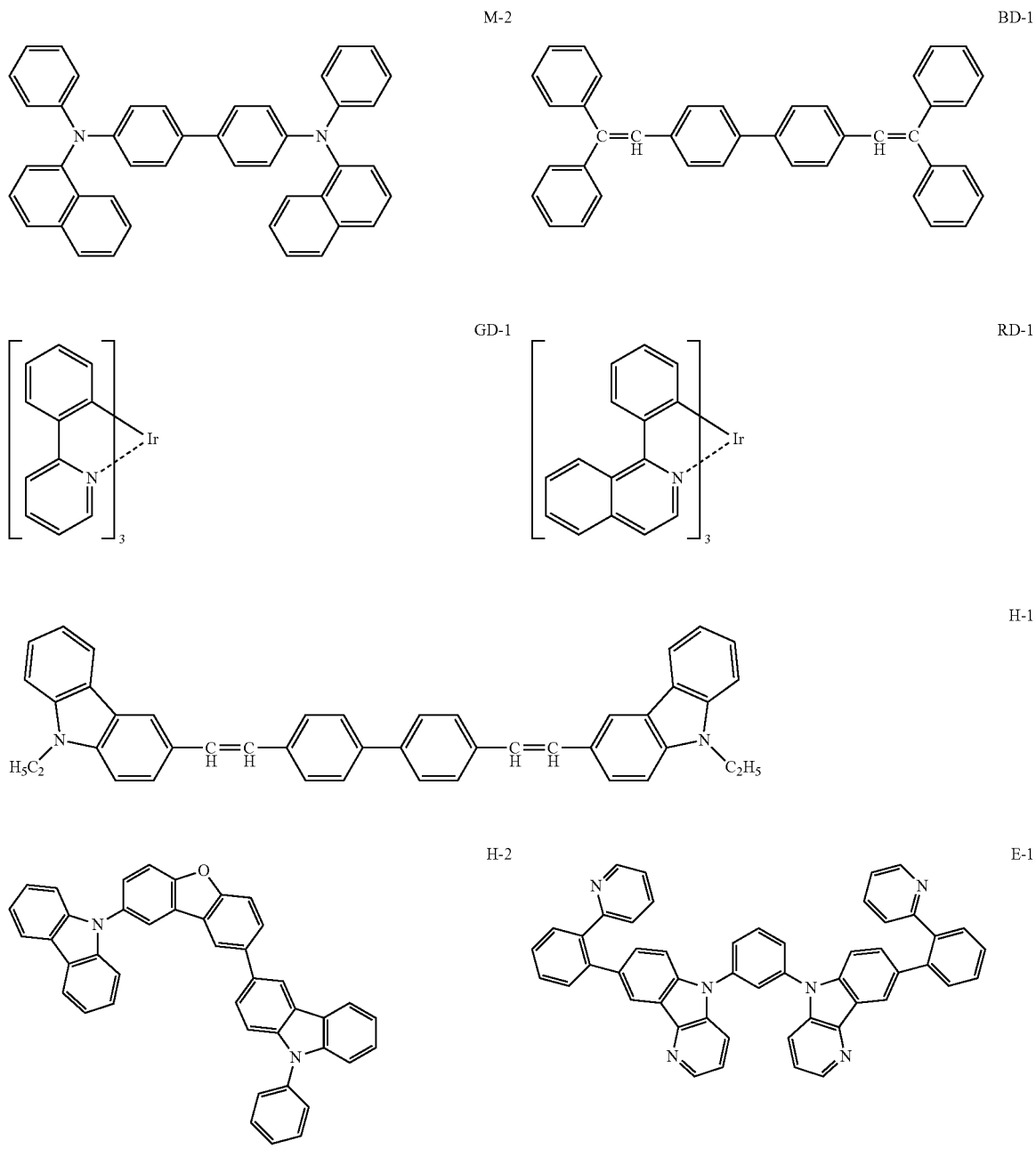

<<Evaluation Methods>>
(1) Measurement of Surface Resistance
Surface resistance was measured with a resistivity meter (MCP-T610 manufactured by Mitsubishi Chemical Analytech Co., Ltd.) by the 4-terminal method, 4-pin probe method and constant-current method.
(2) Measurement of Transmittance
Transmittance was measured with HDN 7000 manufactured by Nippon Denshoku Industries Co., Ltd. on the basis of JIS K 7361-1:1997.
(3) Measurement of Surface Roughness
An area of 5 μm x 5 μm was observed in a tapping mode with SPA 400/NanoNavi II manufactured by SII, and the total height of profile Rt in the length of 5 μm was obtained.

(4) Measurement of Storability (Change Rate in Resistance and Change Rate in Transmittance)
As measurement of storability, the change rate in resistance and the change rate in transmittance were measured.
More specifically, resistance values and transmittances of each transparent electrode sample before and after the transparent electrode sample was stood still for 250 hours in a thermostat oven of 85° C. and a relative humidity of 4% or less were compared with one another. The change rate(s) is shown by a value obtained by "(value after still standing for 250 hours)/(value before still standing for 250 hours)× 100".

The evaluation results are shown in TABLE 2.

TABLE 2

| | | | | STORABILITY | | |
|---|---|---|---|---|---|---|
| TRANSPARENT ELECTRODE NO. | SURFACE RESISTANCE [Ω/□] | TRANSMITTANCE [%] | SURFACE ROUGHNESS Rt [nm] | CHANGE RATE IN RESISTANCE [%] | CHANGE RATE IN TRANSMITTANCE [%] | REMARK |
| 101 | 3.0 | 84 | 150 | 200 | 88 | COMPARATIVE EXAMPLE |
| 102 | 3.5 | 84 | 180 | 200 | 88 | COMPARATIVE EXAMPLE |
| 103 | 3.0 | 86 | 120 | 150 | 90 | COMPARATIVE EXAMPLE |
| 104 | 3.5 | 86 | 150 | 150 | 90 | COMPARATIVE EXAMPLE |
| 105 | 1.5 | 84 | 50 | 108 | 95 | PRESENT INVENTION |
| 106 | 1.5 | 84 | 60 | 108 | 95 | PRESENT INVENTION |
| 107 | 1.5 | 84 | 45 | 108 | 95 | PRESENT INVENTION |
| 108 | 1.5 | 86 | 70 | 108 | 96 | PRESENT INVENTION |
| 109 | 1.5 | 86 | 80 | 108 | 96 | PRESENT INVENTION |
| 110 | 1.5 | 86 | 65 | 108 | 96 | PRESENT INVENTION |
| 111 | 1.6 | 84 | 50 | 110 | 95 | PRESENT INVENTION |
| 112 | 1.6 | 84 | 60 | 110 | 95 | PRESENT INVENTION |
| 113 | 1.6 | 84 | 45 | 110 | 95 | PRESENT INVENTION |
| 114 | 1.6 | 86 | 70 | 110 | 96 | PRESENT INVENTION |
| 115 | 1.6 | 86 | 80 | 110 | 96 | PRESENT INVENTION |
| 116 | 1.6 | 86 | 65 | 110 | 96 | PRESENT INVENTION |
| 117 | 2.0 | 84 | 40 | 110 | 95 | PRESENT INVENTION |
| 118 | 2.0 | 86 | 60 | 110 | 96 | PRESENT INVENTION |
| 119 | 1.9 | 84 | 50 | 108 | 95 | PRESENT INVENTION |
| 120 | 1.9 | 84 | 60 | 108 | 95 | PRESENT INVENTION |
| 121 | 1.9 | 84 | 45 | 108 | 95 | PRESENT INVENTION |
| 122 | 1.9 | 86 | 70 | 108 | 96 | PRESENT INVENTION |
| 123 | 1.9 | 86 | 80 | 108 | 96 | PRESENT INVENTION |
| 124 | 1.9 | 86 | 65 | 108 | 96 | PRESENT INVENTION |
| 125 | 1.8 | 84 | 50 | 112 | 94 | PRESENT INVENTION |
| 126 | 1.8 | 84 | 60 | 112 | 94 | PRESENT INVENTION |
| 127 | 1.8 | 84 | 45 | 112 | 94 | PRESENT INVENTION |
| 128 | 1.8 | 86 | 70 | 112 | 95 | PRESENT INVENTION |
| 129 | 1.8 | 86 | 80 | 112 | 95 | PRESENT INVENTION |
| 130 | 1.8 | 86 | 65 | 112 | 95 | PRESENT INVENTION |
| 131 | 1.6 | 84 | 45 | 108 | 95 | PRESENT INVENTION |
| 132 | 1.6 | 84 | 55 | 108 | 95 | PRESENT INVENTION |
| 133 | 1.6 | 84 | 40 | 108 | 95 | PRESENT INVENTION |
| 134 | 1.6 | 86 | 65 | 108 | 96 | PRESENT INVENTION |
| 135 | 1.6 | 86 | 75 | 108 | 96 | PRESENT INVENTION |
| 136 | 1.6 | 86 | 60 | 108 | 96 | PRESENT INVENTION |
| 137 | 1.4 | 84 | 55 | 107 | 96 | PRESENT INVENTION |
| 138 | 1.4 | 86 | 75 | 107 | 97 | PRESENT INVENTION |
| 139 | 1.6 | 84 | 55 | 109 | 96 | PRESENT INVENTION |
| 140 | 1.6 | 84 | 75 | 109 | 97 | PRESENT INVENTION |
| 141 | 1.5 | 85 | 45 | 107 | 96 | PRESENT INVENTION |
| 142 | 1.5 | 85 | 55 | 107 | 96 | PRESENT INVENTION |
| 143 | 1.5 | 85 | 40 | 107 | 96 | PRESENT INVENTION |
| 144 | 1.5 | 87 | 65 | 107 | 97 | PRESENT INVENTION |
| 145 | 1.5 | 87 | 75 | 107 | 97 | PRESENT INVENTION |
| 146 | 1.5 | 87 | 60 | 107 | 97 | PRESENT INVENTION |

<<Evaluation Results>>

By comparing the transparent electrodes 101 to 104 with the transparent electrodes 105, 106, 108 and 109, it is understood that use of plating archives lower resistance although they are the same in the total average height.

Further, by comparing the transparent electrodes 105 to 107 with the transparent electrodes 108 to 110, it is understood that use of ITO as a transparent conductive layer archives higher transmittance and smaller change in transmittance.

Still further, by comparing the transparent electrodes 111 and 114 with the transparent electrodes 117 and 118, it is understood that electrolytic plating achieves lower resistance.

Yet further, by comparing the transparent electrodes 105, 108, 111 and 114 with the transparent electrodes 137, 138, 139 and 140, it is understood that use of the inkjet parallel line drawing method reduces resistance more.

Still further, it is understood that the transparent electrodes of the present invention have smaller values in surface roughness and accordingly are smoother than the transparent electrodes of the comparative example.

Second Example

<<Manufacture of Organic EL Devices>>
(Formation of Layers)

Using the manufactured transparent electrodes 101 to 146, organic EL elements 201 to 246 were manufactured, respectively, as described below.

Note that the samples dried in the glovebox were carried to a vapor-deposition device without being exposed to the air, and the substrates were set therein.

Further, the samples dried in the vacuum chamber were carried in vacuum to a vacuum chamber for vapor deposition, and the substrates were set therein.

Vapor-deposition crucibles of a vacuum deposition device were filled with constitutive materials for the respective layers at their respective optimum amounts to manufacture each element. The vapor-deposition crucibles used were made of a material for resistance heating such as molybdenum or tungsten.

After the pressure was reduced to a vacuum of $1 \times 10^{-4}$ Pa, the vapor-deposition crucible having Compound M-2 therein was electrically heated, and Compound M-2 was deposited on the transparent support substrate at a deposition rate of 0.1 nm/sec. Thus, a positive hole injection-transport layer having a thickness of 40 nm was formed.

Next, Compounds BD-1 and H-1 were co-deposited at a deposition rate of 0.1 nm/sec. in such a way that the concentration of Compound BD-1 was 5 percent by volume. Thus, a blue florescent layer having a thickness of 15 nm was formed.

Next, Compounds GD-1, RD-1 and H-2 were co-deposited at a deposition rate of 0.1 nm/sec. in such a way that the concentration of Compound GD-1 was 17 percent by volume, and the concentration of Compound RD-1 was 0.8 percent by volume. Thus, a yellow phosphorescent layer having a thickness of 15 nm was formed.

Thereafter, Compound E-1 was deposited at a deposition rate of 0.1 nm/sec. Thus, an electron transport layer having a thickness of 30 nm was formed.

Further, after LiF was formed to be a thickness of 1.5 nm, aluminum was deposited to be 110 nm. Thus, a cathode was formed.

(Sealing)

<Preparation of Adhesive Composition>

100 parts by mass of "Oppanol B50 (manufactured by BASF, Mw: 340,000)" as a polyisobutylene resin, 30 parts by mass of "Nisseki Polybutene Grade HV-1900 (manufactured by Nippon Oil Corporation, Mw: 1,900)" as a polybutene resin, 0.5 parts by mass of "TINUVIN 765 (manufactured by BASF Japan, having a tertiary hindered amine group)" as a hindered amine light stabilizer, 0.5 parts by mass of "IRGANOX 1010 (manufactured by BASF Japan, both of β positions of a hindered phenol group have tert-butyl groups)" as a hindered phenol antioxidant, and 50 parts by mass of "Eastotac H-100L Resin (manufactured by Eastman Chemical Company)" as a cyclic olefin polymer were dissolved in toluene. Thus, an adhesive composition having a solid content concentration of about 25 percent by mass was prepared.

<Manufacture of Sealing Member>

First, a polyethylene terephthalate film having a thickness of 50 μm with an aluminum (Al) foil having a thickness of 100 μm attached was prepared as a sealing base material.

Next, a solution of the prepared adhesive composition was applied to the aluminum side (gas barrier layer side) of the sealing base material in such a way that the thickness of an adhesive layer to be formed after being dried was 20 μm, and dried at 120° C. for two minutes. Thus, an adhesive layer was formed.

Next, to the surface of the formed adhesive layer, a surface of a polyethylene terephthalate film having a thickness of 38 μm, the surface being release-treated, was attached as a release sheet. Thus, a sealing member was produced.

Thus-produced sealing member was left for 24 hours or more in a nitrogen atmosphere. Thereafter, the release sheet was removed, and laminating was carried out in such a way as to cover the cathode of each organic EL element with a vacuum laminator heated to 80° C. Further, heating was carried out at 120° C. for 30 minutes, so that sealing was carried out.

<<Evaluation Methods>>

(1) Luminance, Voltage and Rectification Property

A current of 50 A/m² was made to follow through each organic EL element, so that each organic EL element emitted light. As a current source, 6243 manufactured by ADC Corporation was used. Also, voltage was measured with 6243 manufactured by ADC Corporation.

Luminance was measured at the center with a spectroradiometer CS-2000 (manufactured by Konica Minolta, Inc.). For measurement of luminance, distance from the spectroradiometer was adjusted, and the measurement area was made to be φ3 mm.

Luminance and voltage are each shown as a relative value, taking the organic EL element 201 as a reference.

Rectification property (rectification ratio) was obtained as a ratio of current values which had been obtained by applying positive and negative voltages to each organic EL element. To be specific, it is the absolute value of "(rectification ratio)=l1 (ampere)/l2 (ampere)", wherein l1 and l2 represent current values obtained by application of +2.5 V and −2.5 V, respectively. The result was evaluated as follows. In the evaluation, "A" and "B" have no problem in practical use.

A: $1 \times 10^3$ or more

B: less than $1 \times 10^3$ and $1 \times 10^2$ or more

C: less than $1 \times 10^2$ (2) Measurement of Storability (Change Rate in Luminance)

Luminance was measured before and after each organic EL element was stored for 250 hours in a thermostat oven of 85° C. (humidity of 4% or less).

The change rate in luminance was obtained as follows.

Change Rate in Luminance (%)=(Luminance after Storing at 85° C.)/(Luminance before Storing at 85° C.)×100

The evaluation results are shown in TABLE 3.

TABLE 3

| ORGANIC EL ELEMENT NO. | TRANSPARENT ELECTRODE NO. | EVALUATION RESULT | | | | |
|---|---|---|---|---|---|---|
| | | LUMINANCE (RELATIVE VALUE) | VOLTAGE (RELATIVE VALUE) | RECTIFICATION PROPERTY | STORABILITY CHANGE RATE IN LUMINANCE [%] | REMARK |
| 201 | 101 | 100 | 100 | C | 60 | COMPARATIVE EXAMPLE |
| 202 | 102 | 100 | 100 | C | 60 | COMPARATIVE EXAMPLE |
| 203 | 103 | 103 | 98 | C | 62 | COMPARATIVE EXAMPLE |
| 204 | 104 | 103 | 98 | C | 62 | COMPARATIVE EXAMPLE |
| 205 | 105 | 120 | 80 | A | 93 | PRESENT INVENTION |
| 206 | 106 | 120 | 80 | B | 93 | PRESENT INVENTION |

TABLE 3-continued

EVALUATION RESULT

| ORGANIC EL ELEMENT NO. | TRANSPARENT ELECTRODE NO. | LUMINANCE (RELATIVE VALUE) | VOLTAGE (RELATIVE VALUE) | RECTIFICATION PROPERTY | STORABILITY CHANGE RATE IN LUMINANCE [%] | REMARK |
|---|---|---|---|---|---|---|
| 207 | 107 | 120 | 80 | A | 93 | PRESENT INVENTION |
| 208 | 108 | 124 | 78 | B | 95 | PRESENT INVENTION |
| 209 | 109 | 124 | 78 | B | 95 | PRESENT INVENTION |
| 210 | 110 | 124 | 78 | B | 95 | PRESENT INVENTION |
| 211 | 111 | 110 | 83 | B | 91 | PRESENT INVENTION |
| 212 | 112 | 110 | 83 | B | 91 | PRESENT INVENTION |
| 213 | 113 | 110 | 83 | A | 91 | PRESENT INVENTION |
| 214 | 114 | 113 | 81 | B | 93 | PRESENT INVENTION |
| 215 | 115 | 113 | 81 | B | 93 | PRESENT INVENTION |
| 216 | 116 | 113 | 81 | B | 93 | PRESENT INVENTION |
| 217 | 117 | 109 | 89 | A | 90 | PRESENT INVENTION |
| 218 | 118 | 112 | 87 | B | 92 | PRESENT INVENTION |
| 219 | 119 | 116 | 90 | A | 92 | PRESENT INVENTION |
| 220 | 120 | 116 | 90 | B | 92 | PRESENT INVENTION |
| 221 | 121 | 116 | 90 | A | 92 | PRESENT INVENTION |
| 222 | 122 | 119 | 88 | B | 94 | PRESENT INVENTION |
| 223 | 123 | 119 | 88 | B | 94 | PRESENT INVENTION |
| 224 | 124 | 119 | 88 | B | 94 | PRESENT INVENTION |
| 225 | 125 | 108 | 85 | A | 90 | PRESENT INVENTION |
| 226 | 126 | 108 | 85 | B | 90 | PRESENT INVENTION |
| 227 | 127 | 108 | 85 | A | 90 | PRESENT INVENTION |
| 228 | 128 | 111 | 83 | B | 92 | PRESENT INVENTION |
| 229 | 129 | 111 | 83 | B | 92 | PRESENT INVENTION |
| 230 | 130 | 111 | 83 | B | 92 | PRESENT INVENTION |
| 231 | 131 | 119 | 81 | A | 91 | PRESENT INVENTION |
| 232 | 132 | 119 | 81 | B | 91 | PRESENT INVENTION |
| 233 | 133 | 119 | 81 | A | 91 | PRESENT INVENTION |
| 234 | 134 | 123 | 79 | B | 93 | PRESENT INVENTION |
| 235 | 135 | 123 | 79 | B | 93 | PRESENT INVENTION |
| 236 | 136 | 123 | 79 | B | 93 | PRESENT INVENTION |
| 237 | 137 | 121 | 79 | B | 94 | PRESENT INVENTION |
| 238 | 138 | 121 | 79 | B | 96 | PRESENT INVENTION |
| 239 | 139 | 124 | 77 | B | 94 | PRESENT INVENTION |
| 240 | 140 | 124 | 77 | B | 96 | PRESENT INVENTION |
| 241 | 141 | 121 | 79 | A | 94 | PRESENT INVENTION |
| 242 | 142 | 121 | 79 | B | 94 | PRESENT INVENTION |
| 243 | 143 | 121 | 79 | A | 94 | PRESENT INVENTION |
| 244 | 144 | 125 | 77 | B | 96 | PRESENT INVENTION |
| 245 | 145 | 125 | 77 | B | 96 | PRESENT INVENTION |
| 246 | 146 | 125 | 77 | B | 96 | PRESENT INVENTION |

<<Evaluation Results>>

By comparing the organic EL elements 201 to 204 with the organic EL elements 205, 206, 208 and 209, it is understood that use of plating archives higher luminance and lower voltage although they are the same in the total average height. This is preferable because storing changes properties little.

Further, by comparing the organic EL elements 205 to 207 with the organic EL elements 208 to 210, it is understood that use of ITO as a transparent conductive layer archives higher luminance and smaller change in luminance.

Still further, by comparing the organic EL elements 211 and 214 with the organic EL elements 217 and 218, it is understood that electrolytic plating achieves higher luminance and preferable voltage.

Yet further, by comparing the organic EL elements 211 to 216 with the organic EL elements 219 to 224, it is understood that nickel plating achieves higher luminance. It is estimated that this preferable result is due to high reflection of thin metal wires.

Still further, by comparing the organic EL elements 205, 208, 211 and 214 with the organic EL elements 237, 238, 239 and 240, it is understood that use of the inkjet parallel line drawing method increases luminance more and reduces voltage more.

Yet further, it is understood that the organic EL elements of the present invention are better than the organic EL elements of the comparative example in rectification property.

Still further, by comparing the organic EL elements 205 and 207 with the organic EL elements 208 and 210, respectively, it is understood that use of PEDOT/PSS as a transparent conductive layer achieves better rectification property.

Although embodiments of the present invention have been described and illustrated in detail, it is clearly understood that the same is by way of illustration and example only and is not to be taken by way of limitation, and the scope of the present invention should be interpreted by terms of the appended claims.

INDUSTRIAL APPLICABILITY

The transparent electrode of the present invention can be used in a variety of electronic devices such as an organic EL element, and also can be suitably used in those provided with organic EL elements such as a display device, a display, a household light, an interior light, backlights of a timepiece and a liquid crystal display device, light sources of a billboard, a signal and an optical storage medium, a light source of an electrophotographic copier, a light source of a device for optical communication processing and a light source of an optical sensor as well as light sources for wide emission of light of general household electric appliances and so forth which require display devices.

DESCRIPTION OF REFERENCE NUMERALS

10 Transparent Electrode
11 Substrate
12 Conductive Metal Layer
13 Thin Metal Wire
13a Metal Nanoparticle Ink
14 Plating Layer
15 Transparent Conductive Layer
70 Organic EL Element
71 Counter Electrode
72 Organic Functional Layer
73 Extraction Electrode
74 Sealing Member
1 Base Material
2, 4 Linear Liquid
3, 5 Parallel Line Pattern
31, 32, 51, 52 Line Segment
X Crossing Part

The invention claimed is:

1. A transparent electrode comprising:
a substrate; and
a conductive metal layer on the substrate, wherein
the conductive metal layer has a thin metal wire and a plating layer covering the thin metal wire,
the transparent electrode further comprises a transparent conductive layer on a surface of the substrate on a side on which the thin metal wire is formed, the transparent conductive layer covering the substrate and the conductive metal layer, and
the thin metal wire is formed using a metal nanoparticle ink or a metal complex ink, and the metal nanoparticle ink and the metal complex ink comprise at least one metal selected from the group consisting of gold, silver, copper, iron, cobalt, nickel, chromium, and alloys thereof.

2. The transparent electrode according to claim 1, wherein the thin metal wire is formed by printing.

3. The transparent electrode according to claim 1, wherein the thin metal wire is formed using an inkjet parallel line drawing method.

4. The transparent electrode according to claim 1, wherein the transparent conductive layer contains a conductive polymer.

5. The transparent electrode according to claim 1, wherein the transparent conductive layer contains a metal oxide.

6. An organic electroluminescent element comprising the transparent electrode according to claim 1.

7. The transparent electrode according to claim 1, wherein the metal nanoparticle ink and the metal complex ink comprise at least one metal selected from the group consisting of gold, silver, and copper.

8. The transparent electrode according to claim 1, wherein the metal nanoparticle ink and the metal complex ink comprise silver.

9. The transparent electrode according to claim 1, wherein the plating layer is formed by an electrolytic plating.

10. The transparent electrode according to claim 1, wherein the metal nanoparticle ink contains metal nanoparticles, and the metal nanoparticles have an average particle size of 1 to 100 nm.

11. The transparent electrode according to claim 1, wherein the metal nanoparticle ink contains metal nanoparticles, and the metal nanoparticles are observable as circles, ovals, or substantial circles or substantial ovals with an electron microscope.

12. A method for manufacturing a transparent electrode, comprising:
forming a thin metal wire on a substrate using a metal nanoparticle ink or a metal complex ink, wherein the metal nanoparticle ink and the metal complex ink comprise at least one metal selected from the group consisting of gold, silver, copper, iron, cobalt nickel, chromium, and alloys thereof;
plating the thin metal wire; and
forming a transparent conductive layer on the plated thin metal wire and a surface of the substrate on a side on which the thin metal wire is formed.

13. The transparent electrode according to claim 12, wherein the metal nanoparticle ink and the metal complex ink comprise at least one metal selected from the group consisting of gold, silver, and copper.

14. The transparent electrode according to claim 12, wherein the metal nanoparticle ink and the metal complex ink comprise silver.

15. The transparent electrode according to claim 12, wherein the thin metal wire is plated by an electrolytic plating.

16. The transparent electrode according to claim 12, wherein the metal nanoparticle ink contains metal nanoparticles, and the metal nanoparticles have an average particle size of 1 to 100 nm.

17. The transparent electrode according to claim 12, wherein the metal nanoparticle ink contains metal nanoparticles, and the metal nanoparticles are observable as circles, ovals, or substantial circles or substantial ovals with an electron microscope.

18. The transparent electrode according to claim 12, wherein the thin metal wire is heated before plating the thin metal wire.

* * * * *